United States Patent
Miyamoto et al.

(10) Patent No.: US 10,216,338 B2
(45) Date of Patent: Feb. 26, 2019

(54) ELECTRONIC DEVICE

(71) Applicant: FUJITSU LIMITED, Kawasaki-shi, Kanagawa (JP)

(72) Inventors: Akinori Miyamoto, Sagamihara (JP); Yuichi Kamata, Isehara (JP); Kiyoshi Taninaka, Ebina (JP); Yasuhiro Endo, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/783,110

(22) Filed: Oct. 13, 2017

(65) Prior Publication Data
US 2018/0052567 A1    Feb. 22, 2018

Related U.S. Application Data

(63) Continuation of application No. PCT/JP2015/062119, filed on Apr. 21, 2015.

(51) Int. Cl.
*G06F 3/041* (2006.01)
*G06F 3/043* (2006.01)
(Continued)

(52) U.S. Cl.
CPC ............. *G06F 3/0433* (2013.01); *G06F 3/01* (2013.01); *G06F 3/011* (2013.01); *G06F 3/016* (2013.01);
(Continued)

(58) Field of Classification Search
CPC . G06F 3/041; G06F 3/045; G06F 3/02; G01R 27/26; G09G 5/00
See application file for complete search history.

(56) References Cited

U.S. PATENT DOCUMENTS 6,091,406 A    7/2000  Kambara et al.
2002/0149561 A1*  10/2002  Fukumoto .......... G01C 21/3664
                                                      345/156
(Continued)

FOREIGN PATENT DOCUMENTS

JP    S63-181021    7/1988
JP    H10-240443    9/1998
(Continued)

OTHER PUBLICATIONS

Masashi Nakatani et al., "The Fishbone Tactile Illusion", Collection of papers of the 10th Congress of The Virtual Reality Society of Japan, Sep. 2005.
(Continued)

*Primary Examiner* — Pegeman Karimi
(74) *Attorney, Agent, or Firm* — Maschoff Brennan

(57) ABSTRACT

An electronic device includes a top panel having a manipulation surface; a coordinate detector configured to detect coordinates of a manipulation input performed on the manipulation surface; a first vibrating element; and a drive controlling part configured to drive the first vibrating element by using a driving signal for generating a natural vibration in an ultrasound frequency band of the manipulation surface, the drive controlling part being configured to drive the vibrating element such that an intensity of the natural vibration changes in accordance with a position of the manipulation input and in accordance with a degree of time change of the position, wherein the top panel has a periodic structure whose thickness changes in a periodic manner in accordance with a period of a standing wave in a direction in which antinodes and nodes of the standing wave generated by the natural vibration are arrayed.

13 Claims, 16 Drawing Sheets

(51) Int. Cl.
*G06F 3/01* (2006.01)
*G06F 3/0354* (2013.01)
*G06F 3/0484* (2013.01)

(52) U.S. Cl.
CPC .......... *G06F 3/03547* (2013.01); *G06F 3/041* (2013.01); *G06F 3/043* (2013.01); *G06F 3/0484* (2013.01); *G06F 2203/014* (2013.01); *H03K 2217/96011* (2013.01)

(56) References Cited

U.S. PATENT DOCUMENTS

| | | |
|---|---|---|
| 2007/0247019 A1 | 10/2007 | Takasaki |
| 2009/0284485 A1 | 11/2009 | Colgate et al. |
| 2010/0127975 A1 | 5/2010 | Jensen |
| 2011/0285666 A1* | 11/2011 | Poupyrev ................ G06F 3/016 345/174 |
| 2011/0291976 A1* | 12/2011 | Takada ................... G06F 3/016 345/173 |
| 2013/0222339 A1 | 8/2013 | Koga |
| 2013/0285910 A1* | 10/2013 | Adachi ................... G06F 3/016 345/159 |
| 2014/0347322 A1* | 11/2014 | Kamata .................. G06F 3/041 345/174 |
| 2016/0209979 A1 | 7/2016 | Endo et al. |

FOREIGN PATENT DOCUMENTS

| | | |
|---|---|---|
| JP | 2007-533040 | 11/2007 |
| JP | 2010-528381 | 8/2010 |
| JP | 2010-238222 | 10/2010 |
| JP | 2011-090615 | 5/2011 |
| JP | 2013-200863 | 10/2013 |
| WO | 2005/103873 | 11/2005 |
| WO | 2015/045482 | 4/2015 |

OTHER PUBLICATIONS

Takeyuki Dohda et al., "The Printed-matter Typecasting Method for Haptic Feel Design and Sticky-band Illusion", The collection of papers of the 11th SICE system integration division annual conference (SI2010, Sendai), Dec. 2010, pp. 174 to 177 Abstract.
Written Opinion of The International Searching Authority of Int. Appl. No. PCT/JP2015/062119 dated Jun. 2, 2015 translation of the relevant part.
International Search Report of Int. Appl. No. PCT/JP2015/062119 dated Jun. 2, 2015.
Extended European Search Report dated Feb. 16, 2018 issued with respect to the corresponding European Patent Application No. 15889841.1.

* cited by examiner

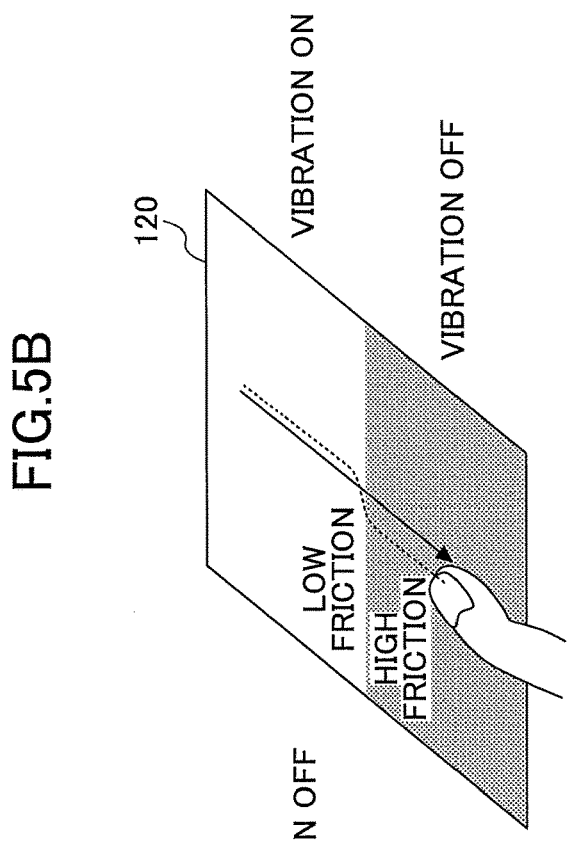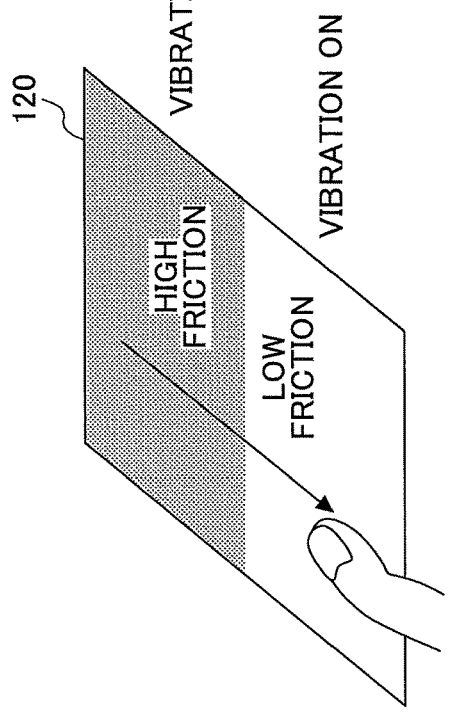

FIG.7A

| MOVING SPEED | AMPLITUDE VALUE |
|---|---|
| $0 \leq V < b1$ | 0 |
| $b1 \leq V < b2$ | A1 |
| $b2 \leq V < b3$ | A2 |
| | |

FIG.7B

| APPLICATION ID | AREA DATA | VIBRATION PATTERN |
|---|---|---|
| 1 | f1=(X,Y) | P1 |
| 1 | f2=(X,Y) | P2 |
| 1 | f3=(X,Y) | P3 |
| 1 | f4=(X,Y) | P4 |
| | | |

US 10,216,338 B2

ELECTRONIC DEVICE

CROSS-REFERENCE TO RELATED APPLICATION

This application is a continuation application of International Application PCT/JP2015/062119 filed on Apr. 21, 2015 and designated the U.S., the entire contents of which are incorporated herein by reference.

FIELD

The embodiments discussed herein relate to an electronic device.

BACKGROUND

Conventionally, there exists a tactile communication device that includes an input part, a plurality of vibration parts provided on the input part, and a control part that vibrates a part of the plurality of vibration parts in accordance with an input position being pressed (for example, see Patent Document 1).

However, it is difficult for the conventional tactile communication device to efficiently generate a vibration because of having a configuration in which a vibration is generated on the entire panel touched by a user's fingertip.

RELATED-ART DOCUMENTS

Patent Documents

[Patent Document 1] Japanese Laid-open Patent Publication No. 2011-090615

SUMMARY

According to an aspect of the embodiments, an electronic device includes a top panel having a manipulation surface; a coordinate detector configured to detect coordinates of a manipulation input performed on the manipulation surface; a first vibrating element configured to generate a vibration at the manipulation surface; and a drive controlling part configured to drive the first vibrating element by using a driving signal for generating a natural vibration in an ultrasound frequency band of the manipulation surface, the drive controlling part being configured to drive the vibrating element such that an intensity of the natural vibration changes in accordance with a position of the manipulation input performed on the manipulation surface and in accordance with a degree of time change of the position, wherein the top panel has a periodic structure whose thickness changes in a periodic manner in accordance with a period of a standing wave in a direction in which antinodes and nodes of the standing wave generated by the natural vibration are arrayed.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIGS. 5A and 5B are diagrams illustrating cases where a kinetic friction force applied to a user's fingertip performing a manipulation input is varied by the natural vibration in the ultrasound frequency band generated at the top panel of the electronic device;

FIGS. 7A and 7B are diagrams illustrating first data and second data stored in a memory;

DESCRIPTION OF EMBODIMENT

Hereinafter, an embodiment to which an electronic device of the present invention is applied will be described. It is an object in one aspect of the embodiments to provide an electronic device that can efficiently generate a vibration.

Embodiment

Figure 1:
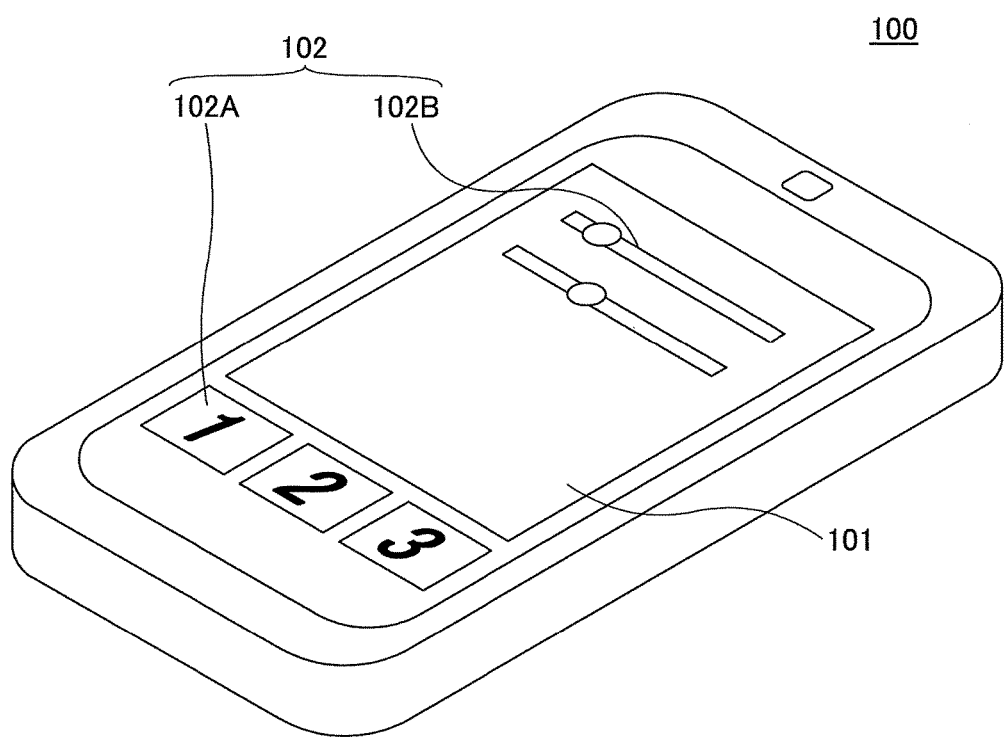
FIG. 1 is a perspective view illustrating an electronic device according to an embodiment.

FIG. 1 is a perspective view illustrating an electronic device 100 according to an embodiment.

For example, the electronic device 100 is a smartphone terminal device or a tablet computer that has a touch panel as a manipulation input part. The electronic device 100 may be any device as long as the device has a touch panel as a manipulation input part. Accordingly, the electronic device 100 may be a device such as a portable-type information terminal device, or an Automatic Teller Machine (ATM) placed at a specific location to be used, for example.

For a manipulation input part 101 of the electronic device 100, a display panel is disposed under the touch panel, and various buttons including a button 102A, a slider 102B, or the like (hereinafter referred to as Graphic User Interface (GUI) manipulation part(s) 102) are displayed on the display panel.

A user of the electronic device 100 ordinarily touches the manipulation input part 101 by his or her fingertip(s) in order to manipulate the GUI manipulation part 102.

Next, a detailed configuration of the electronic device 100 will be described with reference to FIG. 2.

Figure 2:
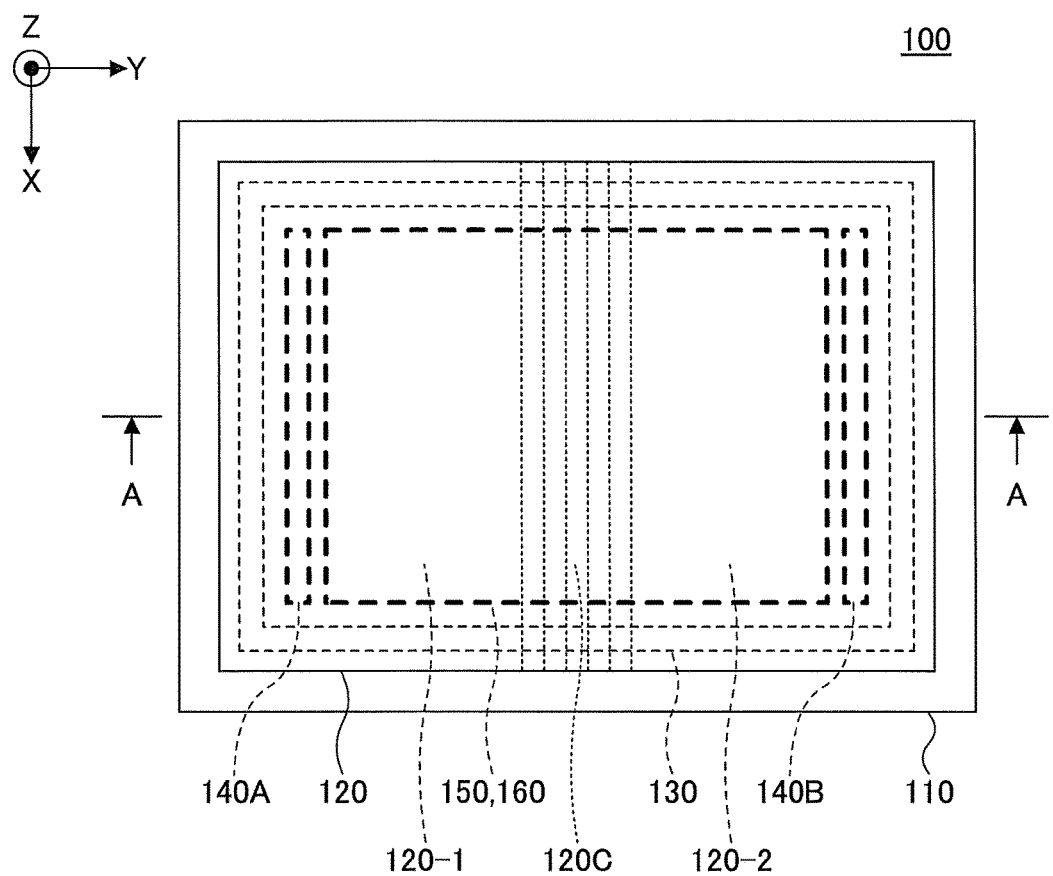
FIG. 2 is a plan view illustrating the electronic device according to the embodiment.
Figure 3:
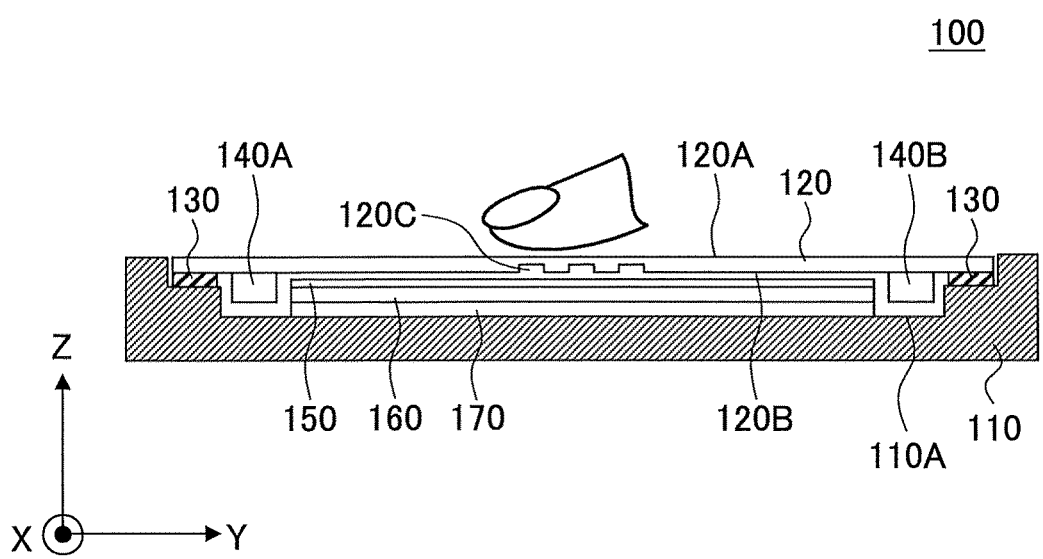
FIG. 3 is a cross-sectional view of the electronic device taken along a line A-A of FIG. 2.

FIG. 2 is a plan view illustrating the electronic device 100 of the embodiment. FIG. 3 is a diagram illustrating a cross-sectional view of the electronic device 100 taken along a line A-A of FIG. 2. It should be noted that an XYZ coordinate system that is an orthogonal coordinate system is defined as illustrated in FIGS. 2 and 3.

The electronic device 100 includes a housing 110, the top panel 120, a double-faced adhesive tape 130, vibrating elements 140A and 140B, the touch panel 150, the display panel 160, and a substrate 170.

The housing 110 is made of a plastic, for example. As illustrated in FIG. 3, the substrate 170, the display panel 160 and the touch panel 150 are disposed in a recessed part 110A of the housing 110, and the top panel 120 is bonded on the housing 110 by the double-faced adhesive tape 130.

The top panel 120 is a thin flat-plate member having a rectangular shape in plan view, and is made of transparent glass or a reinforced plastic such as polycarbonate. A surface of the top panel 120 (a positive side surface in the Z axis direction) is one example of a manipulation surface on which the user of the electronic device 100 performs a manipulation input.

The vibrating elements 140A and 140B are bonded on a negative side surface of the top panel 120 in the Z axis direction, and the four sides in plan view of the top panel 120 are bonded on the housing 110 by the double-faced adhesive tape 130. It should be noted that the double-faced adhesive tape 130 is not necessarily a rectangular-ring-shaped member in plan view as illustrated in FIG. 3, as long as the double-faced adhesive tape 130 can bond the four sides of the top panel 120 to the housing 110.

The touch panel 150 is disposed on the negative side in the Z axis direction of the top panel 120. The top panel 120 is provided in order to protect the surface of the touch panel 150. It should be noted that another panel, protection film or the like may be provided on the surface of the top panel 120.

In a state in which the vibrating elements 140A and 140B are bonded on the negative side surface of the top panel 120 in the Z axis direction, the top panel 120 is vibrated by driving the vibrating element 140A and/or the vibrating element 140B. In the embodiment, a standing wave is generated at the top panel 120 by causing the top panel 120 to vibrate at a natural vibration frequency of the top panel 120. However, because the vibrating elements 140A and 140B are bonded on the top panel 120, it is preferable to determine the natural vibration frequency in consideration of a weight of the vibrating elements 140A and 140B and the like, in practice.

Further, on the back surface 120B of such a top panel 120, a periodic structure 120C is disposed such that the thickness changes along the Y axis direction. The periodic structure 120C has three recessed parts arranged at equal intervals in the Y axis direction. The recessed parts of the periodic structure 120C extend, over the X axis direction, from the positive side edge to the negative side edge of the top panel 120 in the X axis direction. Details of the periodic structure 120C will be described later below with reference to FIG. 9 to FIG. 11.

Note that a negative side portion with respect to the center point of the top panel 120 in the Y axis direction is referred to as the panel part 120-1, and a positive side portion with respect to the center point of the top panel 120 in the Y axis direction is referred to as the panel part 120-2

The vibrating element 140A is bonded on the back surface 120B of the top panel 120, at a negative side in the Y axis direction, along the short side extending in the X axis direction. The vibrating element 140A is an example of a first vibrating element. The vibrating element 140B is bonded on the back surface 120B of the top panel 120, at a positive side in the Y axis direction, along the short side extending in the X axis direction. The vibrating element 140B is an example of a second vibrating element.

That is, the vibrating element 140A is disposed at a negative side in the Y axis direction with respect to the periodic structure 120C, and the vibrating element 140B is disposed at a positive side in the Y axis direction with respect to the periodic structure 120C. The two vibrating elements 140A and 140B may be disposed to be plane-symmetric with respect to a plane parallel to an XZ plane passing through a center line parallel to the two short sides of the top panel 120.

Each of the vibrating elements 140A and 140B may be any element as long as it can generate vibration in an ultrasound frequency band. A piezoelectric element may be used as each of the vibrating elements 140A and 140B, for example. Each of the vibrating elements 140A and 140B is a rectangular thin vibrating element in plan view having long sides in the X axis direction and short sides in the Y axis direction.

Each of the vibrating elements 140A and 140B is driven by a driving signal output from a drive controlling part that will be described later below. An amplitude (intensity) and a frequency of a vibration generated by each of the vibrating elements 140A and 140B are set by the driving signal. Further, on/off of each of the vibrating elements 140A and 140B is controlled by the driving signal.

The vibrating element 140A is driven in a case where a manipulation input is performed on the panel part 120-1, and the vibrating element 140B is driven in a case where a manipulation input is performed on the panel part 120-2.

It should be noted that the ultrasound frequency band is a frequency band that is higher than or equal to approximately 20 kHz, for example. According to the electronic device 100 of the embodiment, the frequency at which the vibrating elements 140A and 140B vibrate is equal to a number of vibrations per unit time (frequency) of the top panel 120. Accordingly, the vibrating elements 140A and 140B are driven in accordance with driving signals so that the vibrating elements 140A and 140B vibrate at a number of natural vibrations per unit time (natural vibration frequency) of the top panel 120.

The touch panel 150 is disposed on (the positive side in the Z axis direction of) the display panel 160 and is disposed under (the negative side in the Z axis direction of) the top panel 120. The touch panel 150 is one example of a coordinate detector that detects a position (in the following, the position is referred to as a position of the manipulation input) at which the user of the electronic device 100 touches the top panel 120.

Various Graphic User Interface (GUI) buttons or the like (hereinafter referred to as GUI manipulation part(s)) are displayed on the display panel 160 located under the touch panel 150. Therefore, the user of the electronic device 100 ordinarily touches the top panel 120 by his or her fingertip(s) in order to manipulate the GUI manipulation part.

The touch panel 150 is any coordinate detector as long as it can detect the position of the manipulation input on the top panel 120 performed by the user. The touch panel 150 may be a capacitance type coordinate detector or a resistance film type coordinate detector, for example. Here, the embodiment in which the touch panel 150 is a capacitance type coordinate detector will be described. The capacitance type touch panel 150 can detect the manipulation input performed on the top panel 120 even if there is a clearance gap between the touch panel 150 and the top panel 120.

Also, although the top panel 120 is disposed on the input surface side of the touch panel 150 in the described embodiment, the top panel 120 may be integrated with the touch panel 150. In this case, the surface of the touch panel 150 is equal to the surface of the top panel 120 illustrated in FIGS. 2 and 3, and the surface of the touch panel 150 constitutes the manipulation surface. The top panel 120 illustrated in FIGS. 2 and 3 may be omitted. In this case, the surface of the touch panel 150 constitutes the manipulation surface. In this case, a member having the manipulation surface may be vibrated at a natural vibration frequency of the member.

In a case where the touch panel 150 is of resistance film type, the touch panel 150 may be disposed on the top panel 120. In this case also, the surface of the touch panel 150 constitutes the manipulation surface. Also, in the case where the touch panel 150 is of capacitance type, the top panel 120 illustrated in FIGS. 2 and 3 may be omitted. In this case also, the surface of the touch panel 150 constitutes the manipulation surface. In this case, a member having the manipulation surface may be vibrated at a natural vibration frequency of the member.

The display panel 160 may be a display part that can display an image. The display panel 160 may be a liquid crystal display panel, an organic Electroluminescence (EL) panel or the like, for example. Inside the recessed part 110A of the housing 110, the display panel 160 is arranged on (the positive side in the Z axis direction of) the substrate 170 using a holder or the like whose illustration is omitted.

The display panel 160 is driven and controlled by a driver Integrated Circuit (IC), which will be described later, and displays a GUI manipulation part, an image, characters, symbols, graphics, and/or the like in accordance with an operating state of the electronic device 100.

The substrate 170 is disposed inside the recessed part 110A of the housing 110. The display panel 160 and the touch panel 150 are disposed on the substrate 170. The display panel 160 and the touch panel 150 are fixed to the substrate 170 and the housing 110 by a holder or the like (not shown).

On the substrate 170, a drive controlling apparatus, which will be described later, and circuits and the like that are necessary for driving the electronic device 100 are mounted.

According to the electronic device 100 having the configuration as described above, when the user touches the top panel 120 with his or her fingertip and a movement of the user's fingertip is detected, the drive controlling part mounted on the substrate 170 drives the vibrating element 140A or 140B to vibrate the top panel 120 at a frequency in the ultrasound frequency band. This frequency in the ultrasound frequency band is a resonance frequency of a resonance system including the top panel 120 and the vibrating elements 140A and 140B and generates a standing wave at the top panel 120.

The electronic device 100 generates the standing waves in the ultrasound frequency band to provide tactile sensations to the user through the top panel 120.

Next, a standing wave generated at the top panel 120 will be described with reference to FIGS. 4A and 4B.

Figures 4A, 4B:
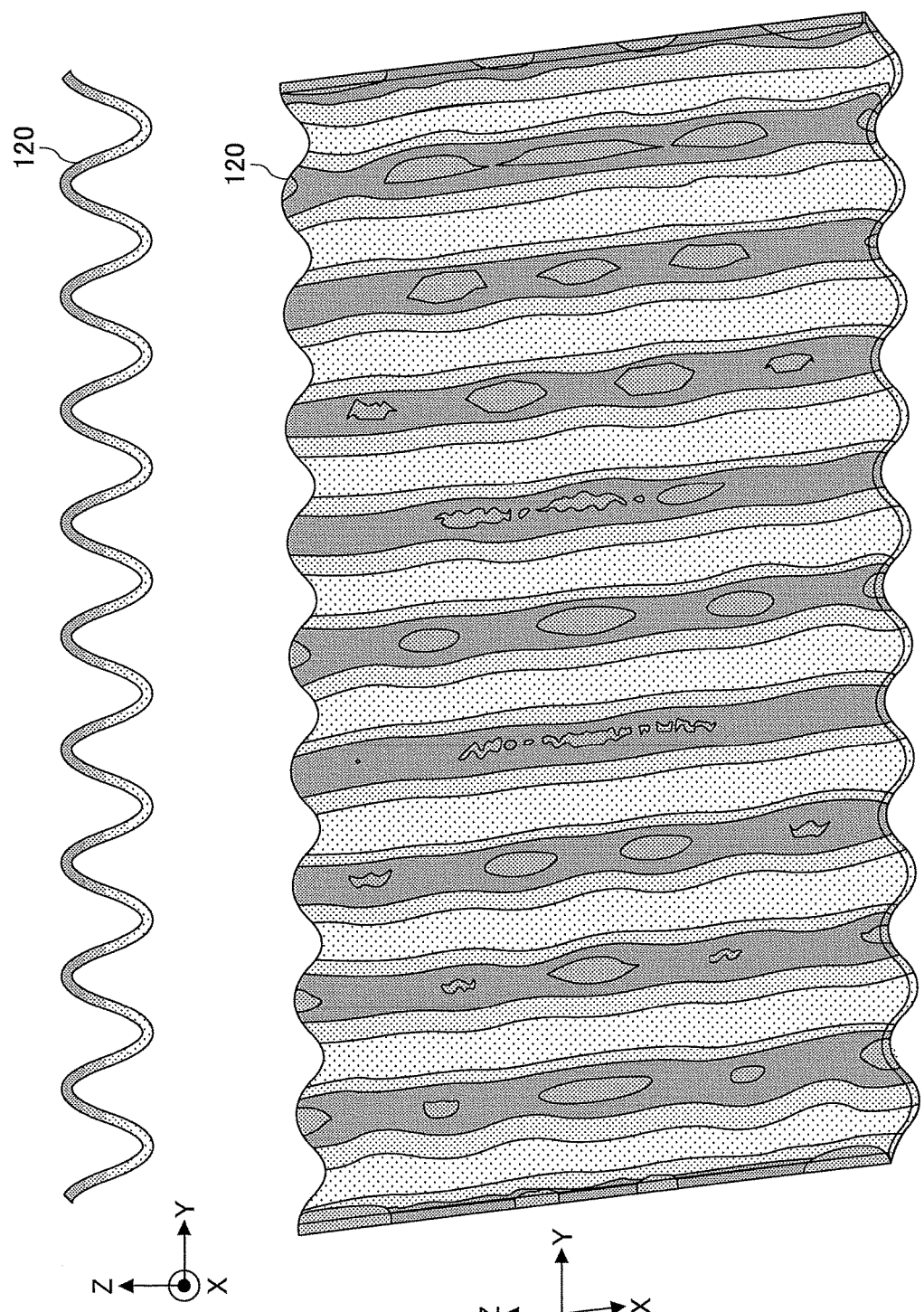
FIGS. 4A and 4B are diagrams illustrating crests formed in parallel with a short side of a top panel included in a standing wave generated at the top panel by a natural vibration in an ultrasound frequency band.

FIGS. 4A and 4B are diagrams illustrating crests formed parallel with the short side of the top panel 120 included in the standing wave generated at the top panel 120 by the natural vibration in the ultrasound frequency band. FIG. 4A is a side view, and FIG. 4B is a perspective view. In FIGS. 4A and 4B, a XYZ coordinate system similar to that of FIGS. 2 and 3 is defined. It should be noted that in FIGS. 4A and 4B, the amplitude of the standing wave is overdrawn in an easy-to-understand manner. Also, the vibrating elements 140A and 140B are omitted in FIGS. 4A and 4B. Further, the standing wave illustrated here is for a case where a periodic structure 120C is not provided on the top panel 120.

The natural vibration frequency (the resonance frequency) f of the top panel 120 is represented by the following formulas (1) and (2) where E is the Young's modulus of the top panel 120, $\rho$ is the density of the top panel 120, $\delta$ is the Poisson's ratio of the top panel 120, l is the long side dimension of the top panel 120, t is the thickness of the top panel 120, and k is a periodic number of the standing wave along the direction of the long side of the top panel 120. Because the standing wave has the same waveform in every half cycle, the periodic number k takes values at intervals of 0.5, therefore at 0.5, 1, 1.5, 2 . . . .

$$f = \frac{\pi k^2 t}{l^2} \sqrt{\frac{E}{3\rho(1-\delta^2)}} \tag{1}$$

$$f = \alpha k^2 \tag{2}$$

It should be noted that the coefficient $\alpha$ included in formula (2) corresponds to coefficients other than $k^2$ included in formula (1).

A waveform of the standing wave illustrated FIGS. 4A and 4B is a waveform of a case where the periodic number k is 10, for example. In a case where a sheet of Gorilla (registered trademark) glass of which the length l of the long side is 140 mm, the length of the short side is 80 mm, and the thickness t is 0.7 mm is used as the top panel 120, for example, the natural vibration frequency f is 33.5 kHz when the periodic number k is 10. In this case, a driving signal whose frequency is 33.5 kHz may be used.

The top panel 120 is a planar member. When the vibrating elements 140A and 140B (see FIGS. 2 and 3) are driven to generate the natural vibration in the ultrasound frequency band at the top panel 120, the top panel 120 deflects as illustrated in FIGS. 4A and 4B. As a result, the standing wave is generated in the surface of the top panel 120. FIGS. 5A and 5B are diagrams illustrating cases where a kinetic friction force applied to a user's fingertip performing a manipulation input is varied by the natural vibration in the ultrasound frequency band generated at the top panel 120 of the electronic device 100. In FIGS. 5A and 5B, while touching the top panel 120 with the user's fingertip, the user performs the manipulation input by moving his or her fingertip along the arrow from a far side to a near side of the top panel 120.

It should be noted that when the vibrating element 140A is driven, the vibration is turned on/off by turning on/off the vibrating element 140A and, when the vibrating element 140B is driven, the vibration is turned on/off by turning on/off the vibrating element 140B.

In FIGS. 5A and 5B, areas which the user's fingertip touches while the vibration is off are indicated in grey, with respect to the depth direction of the top panel 120. Areas which the user's finger touches while the vibration is on are indicated in white, with respect to the depth direction of the top panel 120.

As illustrated in FIGS. 4A and 4B, the natural vibration in the ultrasound frequency band occurs in the entire top panel 120. FIGS. 5A and 5B illustrate operation patterns in which on/off of the vibration is switched while the user's finger is tracing the top panel 120 from the far side to the near side.

Accordingly, in FIGS. 5A and 5B, the areas which the user's finger touches while the vibration is off are indicated in grey, and the areas which the user's finger touches while the vibration is on are indicated in white.

In the operation pattern illustrated in FIG. 5A, the vibration is off when the user's finger is located on the far side of the top panel 120, and the vibration is turned on in the process of moving the user's finger toward the near side.

Conversely, in the operation pattern illustrated in FIG. 5B, the vibration is on when the user's finger is located on the far side of the top panel 120, and the vibration is turned off in the process of moving the user's finger toward the near side.

Here, when the natural vibration in the ultrasound frequency band is generated at the top panel 120, a layer of air is interposed between the surface of the top panel 120 and the user's finger. The layer of air is provided by a squeeze film effect. Thus, a kinetic friction coefficient on the surface of the top panel 120 is decreased when the user traces the surface with the user's finger.

Accordingly, in the grey area located on the far side of the top panel 120 illustrated in FIG. 5A, the kinetic friction force applied to the user's fingertip increases. In the white area located on the near side of the top panel 120, the kinetic friction force applied to the user's fingertip decreases.

Therefore, a user who is performing the manipulation input on the top panel 120 as illustrated in FIG. 5A senses a decrease of the kinetic friction force applied to the user's fingertip when the vibration is turned on. As a result, the user senses a slippery or smooth touch (texture) with the user's fingertip. In this case, the user senses as if a concave portion were present on the surface of the top panel 120, when the surface of the top panel 120 becomes smoother and the kinetic friction force decreases.

Conversely, in the white area located on the far side of the top panel 120 illustrated in FIG. 5B, the kinetic friction force applied to the user's fingertip decreases. In the grey area located on the near side of the top panel 120, the kinetic friction force applied to the user's fingertip increases.

Therefore, a user who is performing the manipulation input on the top panel 120 as illustrated in FIG. 5B senses an increase of the kinetic friction force applied to the user's fingertip when the vibration is turned off. As a result, the user senses a grippy or scratchy touch (texture) with the user's fingertip. In this case, the user senses as if a convex portion were present on the surface of the top panel 120, when the user's fingertip becomes grippy and the kinetic friction force increases.

As described above, the user can feel a concavity and convexity with his or her fingertip in the cases as illustrated in FIGS. 5A and 5B. For example, "The Printed-matter Typecasting Method for Haptic Feel Design and Sticky-band Illusion" (the Collection of papers of the 11th SICE system integration division annual conference (SI2010, Sendai) 174-177, 2010-12) discloses that a person can sense a concavity or a convexity. "Fishbone Tactile Illusion" (Collection of papers of the 10th Congress of the Virtual Reality Society of Japan (September, 2005)) also discloses that a person can sense a concavity or a convexity.

Although a variation of the kinetic friction force when the vibration is switched on/off is described above, a variation of the kinetic friction force is similarly obtained when the amplitude (intensity) of the vibrating element 140A or 140B is varied.

Next, a configuration of the electronic device 100 of the embodiment will be described with reference to FIG. 6.

Figure 6:
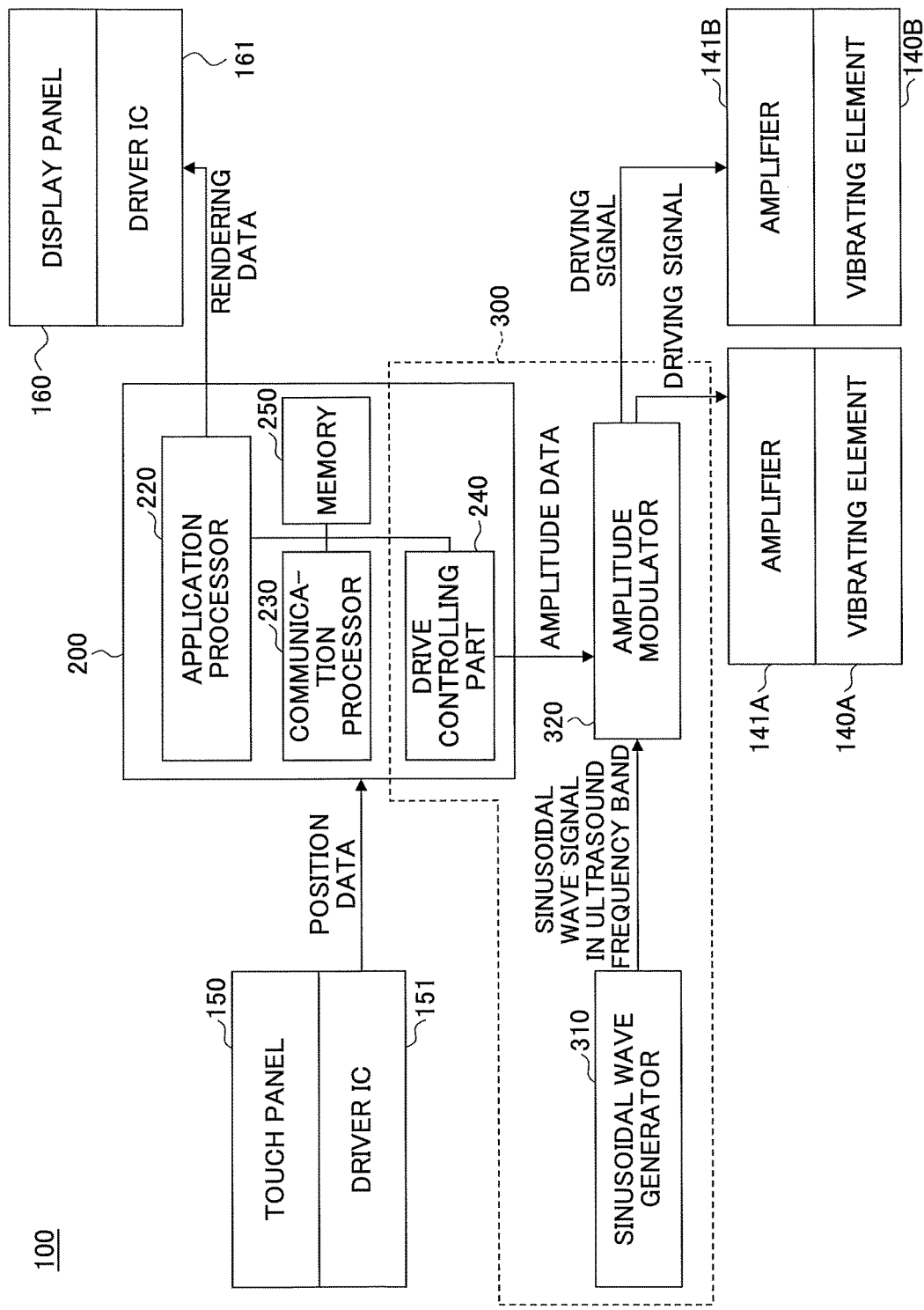
FIG. 6 is a diagram illustrating a configuration of the electronic device according to the embodiment.

FIG. 6 is a diagram illustrating the configuration of the electronic device 100 of the embodiment.

The electronic device 100 includes the vibrating elements 140A and 140B, amplifiers 141A and 141B, the touch panel 150, a driver Integrated Circuit (IC) 151, the display panel 160, a driver IC 161, a controlling part 200, a sinusoidal wave generator 310, and an amplitude modulator 320.

The controlling part 200 includes an application processor 220, a communication processor 230 a drive controlling part 240, and a memory 250. The controlling part 200 is realized by an IC chip, for example.

The drive controlling part 240, the application processor 220, the sinusoidal wave generator 310, and the amplitude modulator 320 constitute a drive controlling apparatus 300. Note that although the application processor 220, the communication processor 230, the drive controlling part 240, and the memory 250 are realized by the single controlling part 200 in the embodiment described here, the drive controlling part 240 may be disposed outside the controlling part 200 as another IC chip or processor. In this case, data that is necessary for drive control of the drive controlling part 240 among data stored in the memory 250, may be stored in a memory other than the memory 250 and may be provided inside the drive controlling apparatus 300.

In FIG. 6, the housing 110, the top panel 120, the double-faced adhesive tape 130, and the substrate 170 (see FIG. 2) are omitted. Here, the double-faced adhesive tape 130, the amplifiers 141A and 141B, the driver IC 151, the driver IC 161, the drive controlling part 240, the memory 250, the sinusoidal wave generator 310, and the amplitude modulator 320 will be described.

The amplifier 141A is disposed between the drive controlling apparatus 300 and the vibrating element 140A. The amplifier 141A amplifies a driving signal output from the drive controlling apparatus 300 to drive the vibrating element 140A. The amplifier 141B is disposed between the drive controlling apparatus 300 and the vibrating element 140B. The amplifier 141B amplifies a driving signal output from the drive controlling apparatus 300 to drive the vibrating element 140B.

The driver IC 151 is coupled to the touch panel 150. The driver IC 151 detects position data that represents a position on the touch panel 150 at which a manipulation input is performed, and outputs the position data to the controlling part 200. As a result, the position data is input to the application processor 220 and the drive controlling part 240. Note that inputting the position data to the drive controlling part 240 is equivalent to inputting the position data to the drive controlling apparatus 300.

The driver IC 161 is coupled to the display panel 160. The driver IC 161 inputs rendering data, output from the drive controlling apparatus 300, to the display panel 160 and causes the display panel 160 to display an image that is based on the rendering data. In this way, a GUI manipulation part, an image, or the like based on the rendering data is displayed on the display panel 160.

The application processor 220 performs processes for executing various applications of the electronic device 100.

The communication processor 230 executes necessary processes so that the electronic device 100 performs communications such as 3G (Generation), 4G (Generation), LTE (Long Term Evolution), and WiFi.

The drive controlling part 240 outputs amplitude data to the amplitude modulator 320 in a case where two predetermined conditions are satisfied. The amplitude data is data that represents amplitude value(s) for adjusting an intensity of a driving signal used to drive each of the vibrating elements 140A and 140B. The amplitude value(s) is set in accordance with a degree of time change of the position data. Here, a speed of the user's fingertip moving along the surface of the top panel 120 is used as the degree of time change of the position data. The drive controlling part 240 calculates the moving speed of the user's fingertip based on a degree of time change of the position data input from the driver IC 151.

The vibrating element 140A is driven when a manipulation input is performed on the panel part 120-1, and the vibrating element 140B is driven when a manipulation input is performed on the panel part 120-2. It is possible, by determining which of the panel part 120-1 or 120-2 includes coordinates detected by the touch panel 150, to determine which of the panel part 120-1 or 120-2 is a part on which a manipulation input is performed.

For example, in order to make a tactile sensation, to be sensed by the user from the user's fingertip, constant regardless of the moving speed of the user's fingertip, the drive controlling apparatus 300 decreases the amplitude value as the moving speed increases, and increases the amplitude value as the moving speed decreases.

First data that represents a relationship between amplitude data, representing such amplitude values, and moving speed is stored in the memory 250.

It should be noted that although the amplitude value in accordance with the moving speed is set by using the first data in the embodiment described here, the amplitude value A may be calculated using the following formula (3). The amplitude value A calculated by the formula (3) decreases as the moving speed increases, and increases as the moving speed decreases.

$$A = A_0 \sqrt{|V|/a} \quad (3)$$

Here, "$A_0$" is a reference value of the amplitude, "V" represents the moving speed of the fingertip and "a" is a predetermined constant value. In a case where the amplitude value A is calculated by using the formula (3), data representing the formula (3) and data, representing the reference value $A_0$ and the predetermined constant value a, may be stored in the memory 250.

The drive controlling apparatus 300 of the embodiment causes the top panel 120 to vibrate in order to vary the kinetic friction force applied to the user's fingertip when the user's fingertip moves along the surface of the top panel 120. Because the kinetic friction force occurs when the user's fingertip is in motion, the drive controlling part 240 causes the vibrating element 140A or 140B to vibrate when the moving speed becomes greater than or equal to a predetermined threshold speed. The first predetermined condition is that the moving speed is greater than or equal to the predetermined threshold speed.

Accordingly, the amplitude value represented by the amplitude data output from the drive controlling part 240 is zero in a case where the moving speed is less than the predetermined threshold speed. The amplitude value is set to be a predetermined amplitude value corresponding to the moving speed in a case where the moving speed becomes greater than or equal to the predetermined threshold speed. When the moving speed is greater than or equal to the predetermined threshold speed, the amplitude value is set to be smaller as the moving speed increases, and the amplitude value is set to be larger as the moving speed decreases.

The drive controlling apparatus 300 of the embodiment outputs the amplitude data to the amplitude modulator 320 in a case where the position of the user's fingertip performing the manipulation input is within a predetermined area in which a vibration is to be generated. The second predetermined condition is that the position of the user's fingertip performing the manipulation input is within the predetermined area in which the vibration is to be generated.

It is determined whether the position of the user's fingertip performing the manipulation input is within the predetermined area, in which a vibration is to be generated, based on whether the position of the user's fingertip performing the manipulation input is located inside the predetermined area in which the vibration is to be generated.

Here, a position of a GUI manipulation part to be displayed on the display panel 160, of an area for displaying an image, of an area representing an entire page, or the like on the display panel 160 is specified by area data that represents the area. The area data is provided, in all applications, with respect to all GUI manipulation parts to be displayed on the display panel 160, the area for displaying an image, or the area representing the entire page.

Accordingly, when the drive controlling apparatus 300 determines, as the second predetermined condition, whether the position of the user's fingertip performing the manipulation input is within the predetermined area in which a vibration is to be generated, a type of the application(s) activated by the electronic device 100 is of concern to the determination. This is because contents displayed on the display panel 160 differ depending on the types of the applications.

Further, this is because types of the manipulation inputs of moving the user's fingertip(s) touching the surface of the top panel 120 differ depending on the types of the applications. For example, there is a flick operation as a type of a manipulation input performed by moving the user's fingertip(s) touching the surface of the top panel 120 when manipulating a GUI manipulation part. The flick operation is an operation performed by moving the user's fingertip for a relatively short distance to flick (snap) the surface of the top panel 120.

In a case where the user turns over a page, a swipe operation is performed, for example. The swipe operation is an operation performed by moving the user's fingertip for a relatively long distance to swipe the surface of the top panel 120. The swipe operation is performed when the user flips a page or a photo, for example. Further, in a case of sliding the slider of the GUI manipulation part (see the slider 102B in FIG. 1), a drag operation is performed to drag the slider.

The manipulation inputs that are performed by moving the user's fingertip(s) touching the surface of the top panel 120, such as the flick operation, the swipe operation and the drag operation that are introduced as examples, are used differently depending on types of displayed contents by the applications. Accordingly, the type of the application executed by the electronic device 100 is related to determining whether the position of the user's fingertip performing the manipulation input is within the predetermined area in which a vibration is to be generated.

The drive controlling part 240 uses the area data to determine whether the position represented by the position data input from the driver IC 151 is within the predetermined area in which a vibration is to be generated.

The memory 250 stores the second data that associates data, which represents the types of the applications, with the area data, which represents the areas of the GUI input parts or the like in which a manipulation input is to be performed, and with pattern data, which represents vibration patterns.

The drive controlling part 240 performs the following processes in order to interpolate a positional change of the position of the user's fingertip during the required duration of time from a point of time when the position data is input to the drive controlling apparatus 300 from the driver IC 151 to a point of time when the driving signal is calculated based on the position data.

The drive controlling apparatus 300 performs calculation for each predetermined control cycle. Similarly, the drive controlling part 240 also performs calculation for each predetermined control cycle. Hence, when the required duration of time, from the point of time when position data is input from the driver IC 151 to the drive controlling apparatus 300 to the point of time when the driving signal is calculated by the drive controlling part 240 based on the position data, is Δt, the required duration Δt of time is equal to the control cycle.

Here, the moving speed of the user's fingertip can be calculated as a velocity of a vector that has a starting point (x1, y1) represented by the position data input to the drive controlling apparatus 300 from the driver IC 151 and a terminal point (x2, y2) corresponding to the position of the user's fingertip after an elapse of the required duration Δt of time.

The electronic device 100 of the embodiment interpolates the positional change of the position of the user's fingertip having arisen in the required duration Δt of time by estimating coordinates after the elapse of the required duration Δt of time as described above.

The drive controlling part 240 performs such calculation of estimating the coordinates after the elapse of the required duration Δt of time. The drive controlling part 240 determines whether the estimated coordinates are located inside the predetermined area in which a vibration is to be generated and generates the vibration when the estimated coordinates are located inside the predetermined area. Accordingly, the second predetermined condition is that the estimated coordinates are located inside the predetermined area in which a vibration is to be generated.

As described above, the two predetermined conditions required for the drive controlling part 240 to output the amplitude data to the amplitude modulator 320 are that the moving speed of the user's fingertip is greater than or equal to the predetermined threshold speed and that the estimated coordinates are located in the predetermined area in which a vibration is to be generated.

In a case where the moving speed of the user's fingertip is greater than or equal to the predetermined threshold speed and the estimated coordinates are located inside the predetermined area in which the vibration is to be generated, the drive controlling part 240 reads amplitude data that represents an amplitude value corresponding to the moving speed from the memory to output the amplitude data to the amplitude modulator 320.

The memory 250 stores the first data that represents a relationship between the amplitude data representing amplitude values and the moving speeds, and stores the second data that associates data, which represents the types of the applications, with the area data, which represents the areas of the GUI input parts or the like in which a manipulation input is to be performed, and with the pattern data, which represents vibration patterns.

Further, the memory 250 stores programs and data necessary for the application processor 220 to execute the applications, and stores programs and data necessary for communicating processes of the communication processor 230, and the like.

The sinusoidal wave generator 310 generates sinusoidal waves required for generating the driving signal that is for vibrating the top panel 120 at the natural vibration frequency. For example, in a case of causing the top panel 120 to vibrate at the natural vibration frequency f of 33.5 kHz, a frequency of the sinusoidal waves becomes 33.5 kHz. The sinusoidal wave generator 310 inputs a sinusoidal wave signal in the ultrasound frequency band to the amplitude modulator 320.

Using the amplitude data input from the drive controlling part 240, the amplitude modulator 320 modulates an amplitude of the sinusoidal wave signal, input from the sinusoidal wave generator 310, to generate a driving signal. The amplitude modulator 320 modulates only the amplitude of the sinusoidal wave signal in the ultrasound frequency band, input from the sinusoidal wave generator 310, to generate the driving signal without modulating a frequency and a phase of the sinusoidal wave signal.

Hence, the driving signal output from the amplitude modulator 320 is a sinusoidal wave signal in the ultrasound frequency band obtained by modulating only the amplitude of the sinusoidal wave signal in the ultrasound frequency band input from the sinusoidal wave generator 310. It should be noted that in a case where the amplitude data is zero, the amplitude of the driving signal is zero. This is the same as the amplitude modulator 320 not outputting the driving signal.

Next, the first data and the second data stored in the memory 250 will be described with reference to FIGS. 7A and 7B.

FIGS. 7A and 7B are diagrams illustrating the first data and the second data stored in the memory 250.

As illustrated in FIG. 7A, the first data is data that associates amplitude data representing amplitude values with moving speeds. According to the first data illustrated in FIG. 7A, the amplitude value is set to be zero when the moving speed is greater than or equal to 0 and less than b1 ($0 \leq V < b1$), the amplitude value is set to be A1 when the moving speed is greater than or equal to b1 and less than b2 ($b1 \leq V < b2$), and the amplitude value is set to be A2 when the moving speed is greater than or equal to b2 and less than b3 ($b2 \leq V < b3$).

Further, as illustrated in FIG. 7B, the second data is data that associates data representing types of applications with area data representing coordinate values of areas where a GUI manipulation part or the like on which a manipulation input is performed is displayed, and with pattern data representing vibration patterns.

FIG. 7B illustrates an application Identification (ID) as data representing the type of the application. Further, FIG. 7B illustrates, as the area data, formulas f1 to f4 representing coordinate values of areas where a GUI manipulation part or the like on which a manipulation input is performed is displayed. Further, FIG. 7B illustrates P1 to P4 as pattern data representing vibration patterns.

Note that the formulas f1 to f4 representing the coordinate values are divided into coordinates included in the panel part 120-1 and coordinates included in the panel part 120-2. This is for driving the vibrating element 140A in a case where a manipulation input is performed on the panel part 120-1, and for driving the vibrating element 140B in a case where a manipulation input is performed on the panel part 120-2.

Note that the applications, represented by the application IDs included in the second data, include all applications usable in a smartphone terminal device or a tablet computer and include a mode for editing an e-mail.

Next, a process that is executed by the drive controlling part 240 of the drive controlling apparatus 300 of the electronic device 100 according to the embodiment will be described with reference to FIG. 8.

Figure 8:
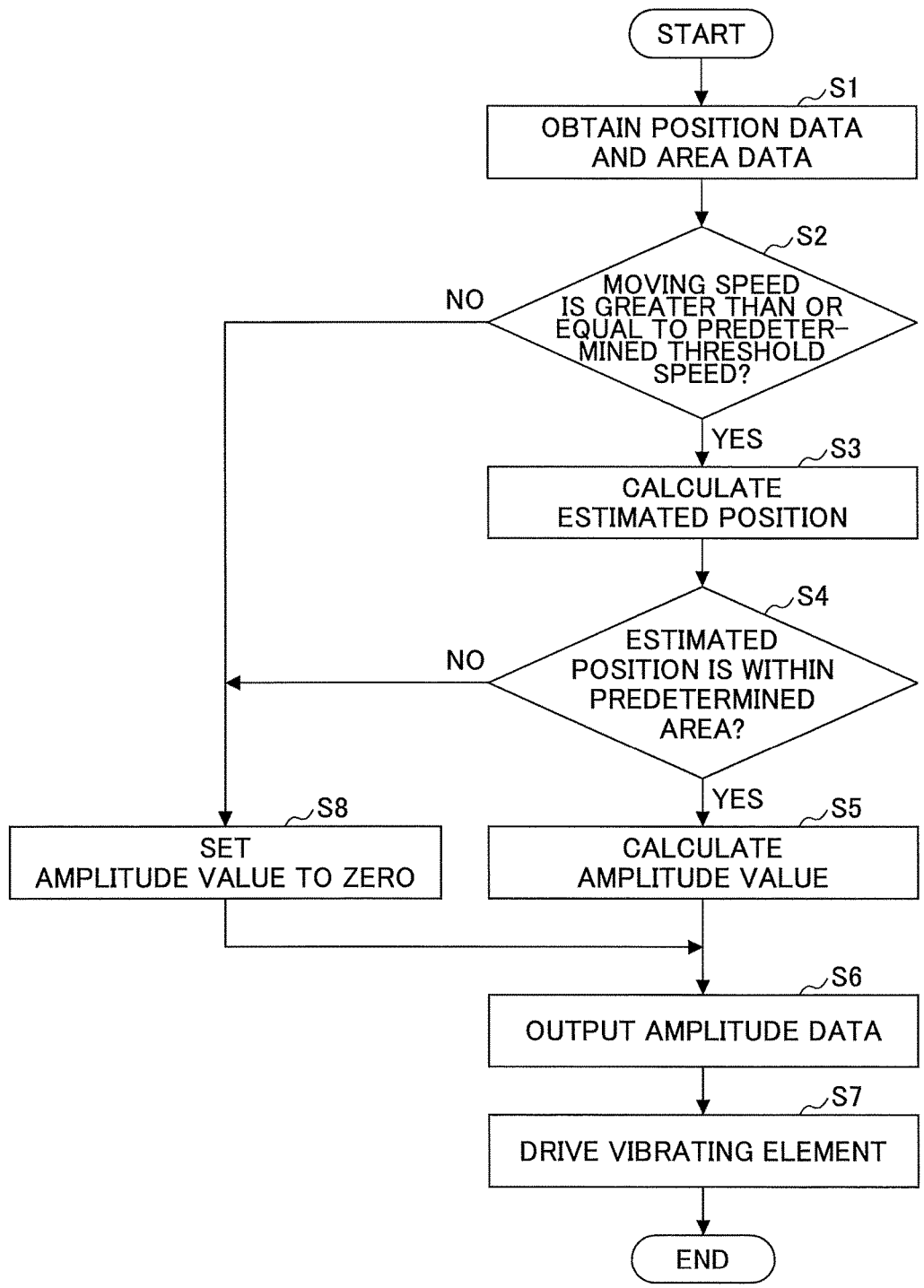
FIG. 8 is a flowchart illustrating a process that is executed by a drive controlling apparatus of the electronic device according to the embodiment.

FIG. 8 is a flowchart illustrating the process that is executed by the drive controlling apparatus 300 of the electronic device 100 according to the embodiment.

An operating system (OS) of the electronic device 100 executes control for driving the electronic device 100 every predetermined control cycle. Accordingly, the drive controlling apparatus 300 performs calculation for every predetermined control cycle to repeatedly execute the flow illustrated in FIG. 8.

Here, when a required period of time, from a point of time when position data is input from the driver IC 151 to the drive controlling apparatus 300 to a point of time when a driving signal is calculated by the drive controlling apparatus 300 based on the position data, is $\Delta t$, the required period $\Delta t$ of time is substantially equal to the control cycle.

A period of time of one cycle of the control cycle can be treated as a period of time corresponding to the required period $\Delta t$ of time, which is required from the point of time at which the position data is input to the drive controlling apparatus 300 from the driver IC 151 to the point of time at which the driving signal is calculated based on the input position data.

The drive controlling apparatus 300 starts the process when the electronic device 100 is powered on.

With respect to a GUI manipulation part on which a manipulation input is currently being performed, the drive controlling apparatus 300 obtains area data in step S1 in accordance with coordinates represented by the current position data and with a type of a current application. The area data is associated with a vibration pattern.

The drive controlling apparatus 300 determines whether the moving speed is greater than or equal to the predetermined threshold speed in step S2. The moving speed may be calculated by a vector operation. The threshold speed may be set to be the minimum speed of the moving speed of the user's fingertip performing the manipulation input while moving the user's fingertip such as a flick operation, a swipe operation, a drag operation or the like. Such a minimum speed may be set based on an experimental result, a resolution of the touch panel 150 or the like.

In a case where the drive controlling apparatus 300 has determined that the moving speed is greater than or equal to the predetermined threshold (YES in step S2), the drive controlling apparatus 300 calculates in step S3 estimated coordinates of after the elapse of the duration $\Delta t$ of time based on the coordinates represented by the current position data and based on the moving speed.

The drive controlling apparatus 300 determines in step S4 whether the estimated coordinates after the elapse of the duration $\Delta t$ of time are located within an area St which is represented by the area data obtained in step S1.

In a case where the drive controlling apparatus 300 determines that the estimated coordinates after the elapse of the duration $\Delta t$ of time are within the area St represented by the region data obtained in step S1, the drive controlling apparatus 300 obtains in step S5, from the first data, amplitude data representing an amplitude value corresponding to the moving speed obtained in step S2.

The drive controlling apparatus 300 outputs the amplitude data in step S6.

The drive controlling part apparatus 300 drives in step S7 the vibrating element 140A or 140B based on the estimated position obtained in step S4. The drive controlling part apparatus 300 drives the vibrating element 140A in a case where the estimated position obtained in step S4 is included in the panel part 120-1, and drives the vibrating element 140B in a case where the estimated position obtained in step S4 is included in the panel part 120-2.

As a result, the amplitude modulator 320 generates a driving signal by modulating the amplitude of the sinusoidal wave output from the sinusoidal wave generator 310, and the vibrating element 140A or 140B is driven by the driving signal.

On the other hand, in a case where drive controlling apparatus 300 has determined that the moving speed is not greater than or not equal to the predetermined threshold speed (NO in step S2) or in a case where the drive controlling apparatus 300 has determined that the estimated coordinates after the elapse of the duration $\Delta t$ of time are not within the area St (NO in step S4), the drive controlling apparatus 300 sets the amplitude value to be zero in step S8).

As a result, the drive controlling apparatus 300 outputs amplitude data of which the amplitude value is zero, and the amplitude modulator 320 generates a driving signal by modulating the amplitude of the sinusoidal wave output from the sinusoidal wave generator 310 to be zero. Accordingly, in this case, the vibrating elements 140A and 140B are not driven.

Note that although the estimated coordinates after the elapse of the duration $\Delta t$ of time are calculated in the embodiment described as an example, an amplitude value may be calculated based on the coordinates, detected by the touch panel 150 in step S1, to drive the vibrating element 140A or 140B without calculating estimated coordinates. For example, in a case where a delay corresponding to the required duration $\Delta t$ of time corresponding to the duration of time of one cycle of the control cycle is not significant, the electronic device 100 is not required to perform the calculation of the estimated coordinates.

Figure 9:
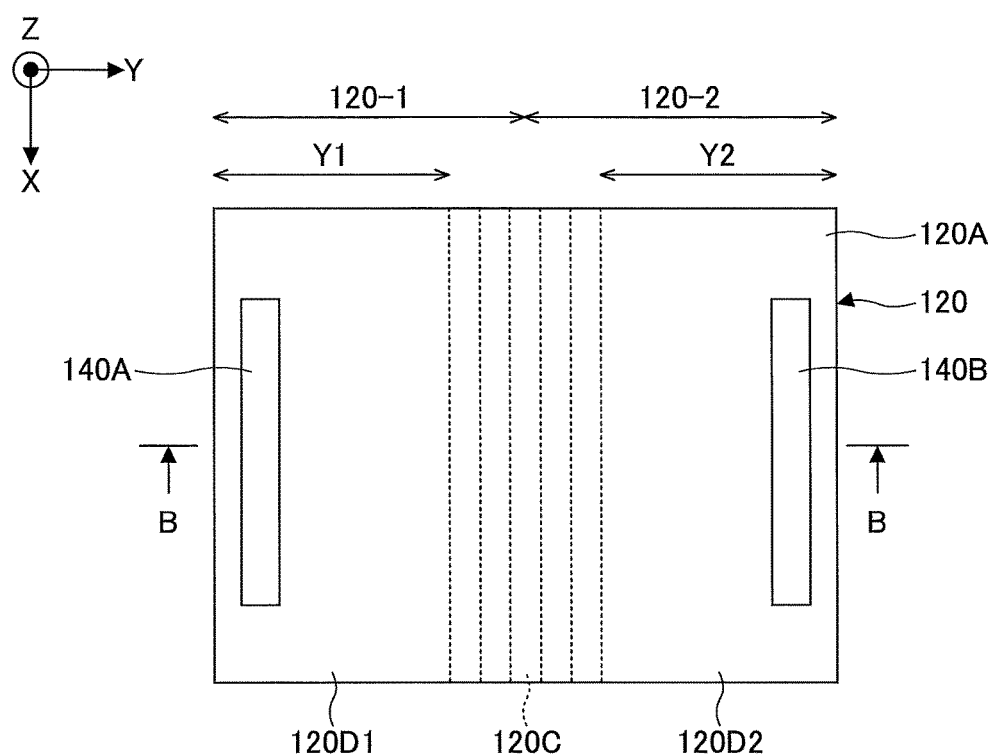
FIG. 9 is a diagram illustrating the top panel having a periodic structure.
Figure 10:
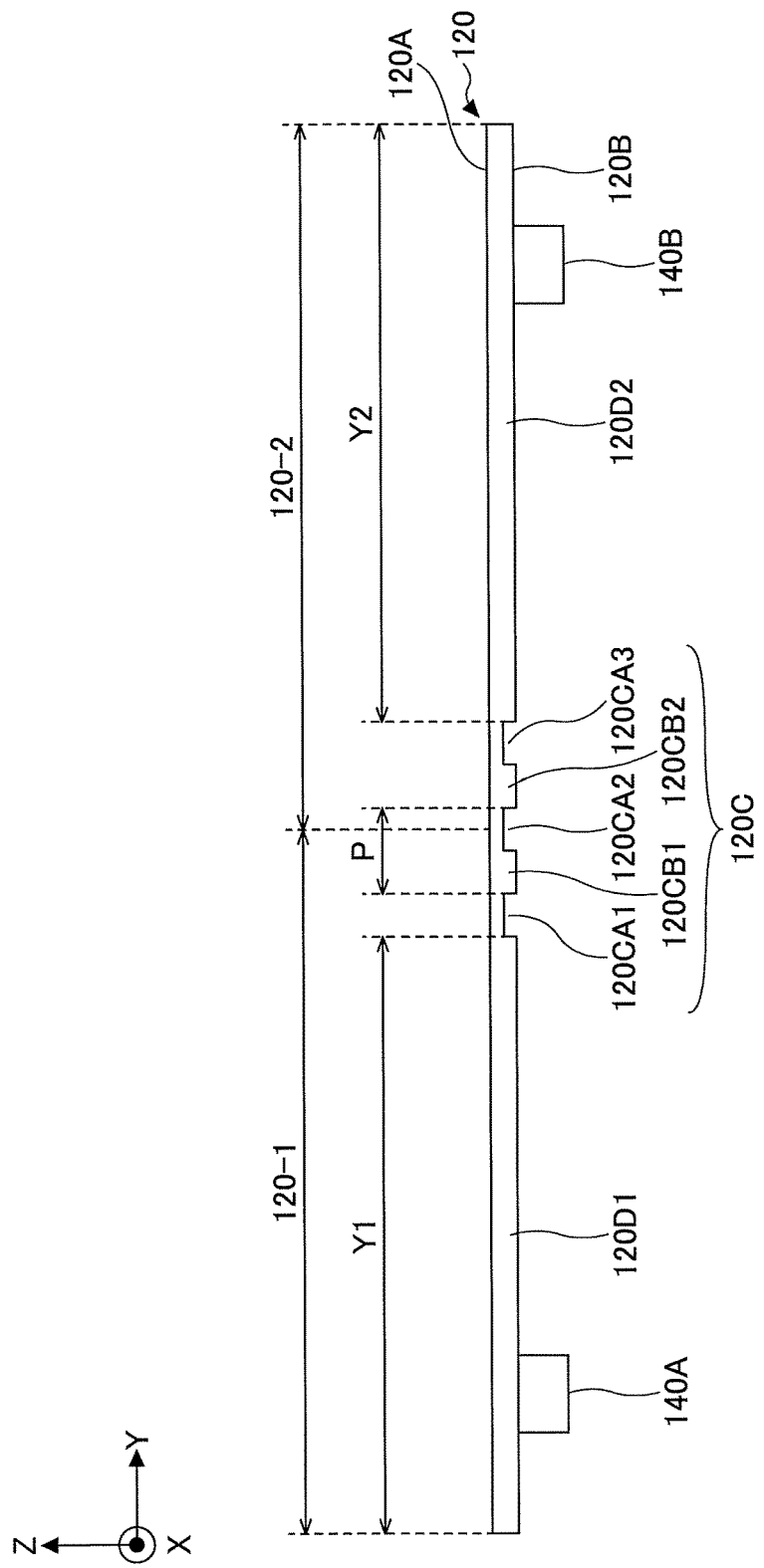
FIG. 10 is a diagram illustrating the top panel having the periodic structure.

FIG. 9 and FIG. 10 are diagrams illustrating the top panel 120 having the periodic structure 120C. FIG. 9 is a plan view, and FIG. 10 is a cross-sectional view taken along a line B-B of FIG. 9. FIG. 9 illustrates the vibrating elements 140A and 140B in a transparent manner.

For example, the periodic structure 120C is disposed on the back surface 120B of the top panel 120. The periodic structure 120C has three recessed parts 120CA1, 120CA2, and 120CA3 arranged at equal intervals in the Y axis direction, and two protruding parts 120CB1 and 120CB2.

The recessed parts 120CA1, 120CA2, and 120CA3 are formed at the equal intervals in the Y axis direction to extend, over the X axis direction, from the positive side edge to the negative side edge of the top panel 120 in the X axis direction.

The protruding parts 120CB1 and 120CB2 are located between the recessed parts 120CA1, 120CA2, and 120CA3 in the Y axis direction to extend, over the X axis direction, from the positive side edge to the negative side edge of the top panel 120 in the X axis direction.

Here, as an example, a width in the Y axis direction and a length in the X axis direction of each of the recessed parts 120CA1, 120CA2, and 120CA3 are equal to a width in the Y axis direction and a length in the X axis direction of each of the protruding parts 120CB1 and 120CB2. Note that the recessed parts 120CA1, 120CA2, and 120CA3 and the protruding parts 120CB1 and 120CB2 may have different widths in the Y axis direction.

Further, as an example, the periodic structure 120C is disposed on the center of the top panel 120 in the Y axis direction.

Hence, the center of the width of the recessed part 120CA2 in the Y axis direction matches the center of the length of the top panel 120 in the Y axis direction. Further, the length Y1 of a flat part 120D1 in the Y axis direction, located at a positive side in the Y axis direction with respect to the periodic structure 120C of the top panel 120, and the length Y2 of a flat part 120D2 in the Y axis direction, located at a negative side in the Y axis direction with respect to the periodic structure 120C of the top panel 120, are equal to each other.

In a case where a wavelength of a standing wave at the flat parts 120D1 and 120D2 is $\lambda p$, the lengths Y1 and Y2 may be set to be a length, obtained by multiplying approximately $\lambda p/2$ by a natural number. This is because having a natural-number-fold length of the half wavelength is a condition for generating a standing wave.

Note that the lengths Y1 and Y2 for generating the natural vibration (standing wave) in the ultrasound frequency band are required to be set in accordance with a structure such as a thickness, a Young's modulus, and a periodic structure 120C of top panel 120, for example. Thus, it is not necessarily preferable to precisely set the lengths Y1 and Y2 to be a natural-number-fold length of $\lambda p/2$. Therefore, description is of as setting the lengths Y1 and Y2 to be a natural-number-fold length of approximately $\lambda p/2$.

For example, the wavelength $\lambda p$ may be set, through a simulation, an experiment, and/or the like, based on a propagation speed or a wavelength of a standing wave at a section of the flat parts 120D1 and 120D2, for example.

A pitch P of the periodic structure 120C may be set to satisfy approximately $\lambda m/2$ when the wavelength of a standing wave generated at the periodic structure 120C is $\lambda m$. Here, the wavelength $\lambda m$ may be treated as a wavelength of a vibration that propagates through the periodic structure 120C.

Note that the pitch P is a pitch between the adjacent recessed parts 120CA1 and 120CA2. A pitch between the adjacent recessed parts 120CA2 and 120CA3 is also the pitch P, and a pitch between the adjacent protruding parts 120CB1 and 120CB2 is also the pitch P.

In this way, the pitch P of the periodic structure 120C is set to be approximately $\lambda m/2$ so as to increase a reflection coefficient by generating a Bragg reflection of a standing wave at the periodic structure 120C. Because a velocity of a standingwave that propagates through the top panel 120 depends on a thickness of the top panel 120, it is possible to constitute a structure suitable for generating a Bragg reflection by changing the thickness of the top panel 120 in a periodic manner.

Note that in some cases, it is difficult to calculate a wavelength $\lambda m$ of a standing wave generated at a section where the periodic structure 120C is present among the top panel 120. Therefore, the wavelength $\lambda m$ may be set, through a simulation, an experiment, and/or the like, based on a propagation speed or a wavelength of a standing wave at the section of the periodic structure 120C, for example.

Further, for example, a thickness of the top panel 120 at the recessed parts 120CA1, 120CA2, and 120CA3 is 0.5 mm, and a thickness of the top panel 120 at the protruding parts 120CB1 and 120CB2 is 0.7 mm.

Figure 11:
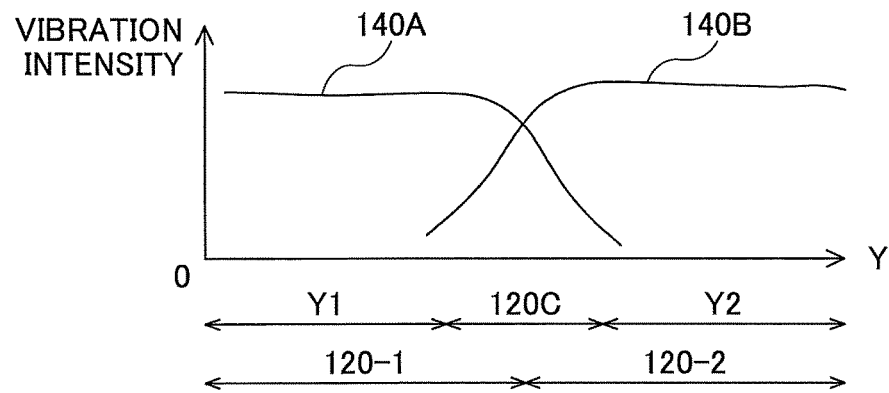
FIG. 11 is a diagram illustrating distributions in the Y axis direction of intensities of vibration generated at the top panel.

FIG. 11 is a diagram illustrating distributions in the Y axis direction of intensities of vibration generated at the top panel 120. The distributions of the vibration intensities illustrated in FIG. 11 schematically illustrate a simulation result by a finite element method using a model of the top panel 120.

The horizontal axis represents a position of the top panel 120 in the Y axis direction, and the negative side edge of the top panel 120 in the Y axis direction corresponds to zero. Further, for the horizontal axis, a section Y1 where the flat part 120D1 is present, a section (120C) where the periodic structure 120C is present, and a section Y2 where the flat part 120D is present are illustrated. Further, the vertical axis represents an intensity of vibration generated at the top panel 120. The intensity of vibration can be treated as the amplitude of the standing wave.

Further, FIG. 11 illustrates a distribution (140A) of vibration intensities for a case where the vibrating element 140A is driven, and illustrates a distribution (140B) of vibration intensities for a case where the vibrating element 140B is driven.

It is found that when the vibrating element 140A is driven, a vibration is generated from the negative side edge of the top panel 120 in the Y axis direction to approximately the positive side edge of the periodic structure 120C in the Y axis direction. The vibration intensity is substantially constant in the section of the flat part 120D1. In the section of the periodic structure 120C, the vibration intensity decreases with increasing distance from the flat part 120D1. Further, it is found that when the vibrating element 140A is driven, the vibration intensity in the section of the flat part 120D2 is reduced to less than or equal to a fraction of the vibration intensity in the section of the flat part 120D1.

Further, it is found that when the vibrating element 140B is driven, a vibration is generated from the positive side edge of the top panel 120 in the Y axis direction to approximately the negative side edge of the periodic structure 120C in the Y axis direction. The vibration intensity is substantially constant in the section of the flat part 120D2. In the section of the periodic structure 120C, the vibration intensity decreases with increasing distance from the flat part 120D2. Further, it is found that when the vibrating element 140B is driven, the vibration intensity in the section of the flat part 120D1 is reduced to less than or equal to a fraction of the vibration intensity in the section of the flat part 120D2.

In this way, it is found that the natural vibration in the ultrasound frequency band can be generated at the flat part 120D1 and the periodic structure 120C by driving the vibrating element 140A, and the natural vibration in the ultrasound frequency band can be generated at the flat part 120D2 and the periodic structure 120C by driving the vibrating element 140B.

This is because the periodic structure 120C makes it difficult to propagate a standing wave between the flat parts 120D1 and 120D2.

Thus, upon driving only the vibrating element 140A, a standing wave is advanced and reflected at the panel part 120-1, and the standing wave is efficiently generated at the panel part 120-1. Upon driving only the vibrating element 140B, a standing wave is advanced and reflected at the panel part 120-2, and the standing wave is efficiently generated at the panel part 120-2.

That is, the vibration intensities illustrated in FIG. 11 are represented by envelope curves of amplitudes at antinodes of standing waves at a positive side in the Z axis direction when the vibrating elements 140A and 140B are driven.

Therefore, the electronic device 100 drives either the vibrating element 140A or 140B in accordance with a position at which the user's fingertip touches the top panel 120. More specifically, when a position of a manipulation input detected by the touch panel 150 is within the panel part 120-1, the electronic device 100 drives the vibrating element 140A. When a position of a manipulation input detected by the touch panel 150 is within the panel part 120-2, the electronic device 100 drives the vibrating element 140B.

In this way, the electronic device 100 drives either the vibrating element 140A or the vibrating element 140B in accordance with a position at which the user's fingertip(s) touches the top panel 120. Hence, the natural vibration (standing wave) in the ultrasound frequency band can be efficiently generated at the panel part 120-1 by driving the vibrating element 140A with more reduced electric power, than a case where a periodic structure 120C is not provided on the top panel 120 and the natural vibration (standing wave) in the ultrasound frequency band is generated at the entire top panel 120 only by the vibrating element 140A.

Similarly, the natural vibration (standing wave) in the ultrasound frequency band can be efficiently generated at the panel part 120-2 by driving the vibrating element 140B with more reduced electric power, than a case where a periodic structure 120C is not provided on the top panel 120 and the natural vibration (standing wave) in the ultrasound frequency band is generated at the entire top panel 120 only by the vibrating element 140B.

That is, the electronic device 100 can efficiently generate a standing wave at either the panel part 120-1 or 120-2 of the top panel 120 by driving either the vibrating element 140A or 140B.

Therefore, the electronic device 100 can reduce electric power consumption.

Losses generated in the electronic device 100 include losses such as mechanical losses in a vibration at the top panel 120, losses in the vibrating elements 140A and 140B, and losses inside the drive controlling apparatus 300. The mechanical losses in a vibration at the top panel 120 are determined depending on an amplitude and an area where the vibration for providing a tactile sensation is generated.

Accordingly, by providing the periodic structure 120C on the top panel 120, the mechanical losses in the vibration at the top panel 120 can be reduced.

Further, by efficiently generating a standing wave at either the panel part 120-1 or 120-2 of the top panel 120, electric power required to drive the vibrating element 140A or 140B can be reduced. Therefore, losses at the vibrating element 140A or 140B can also be reduced.

As described above, according to the embodiment, it is possible to provide the electronic device 100 that can reduce electric power consumption.

Further, because an area of a portion at which a vibration for providing a tactile sensation is generated can be reduced, an emitted amount of ultrasound waves emitted from the surface 120A of the top panel 120 can be reduced.

Note that although the periodic structure 120C is provided on the back surface 120B of the top panel 120 in the embodiment described above, the periodic structure 120C may be provided on the front surface 120A of the top panel 120.

Further, the number of recessed parts of the periodic structure 120C is not limited to three, and may be any suitable number that is two or more. This is because if there are two or more recessed parts, a periodic structure 120C having a pitch P can be constituted.

Further, the periodic structure 120C may be disposed by an offset distance from the center of the top panel 120 in the Y axis direction towards a negative side in the Y axis direction or towards a positive side in the Y axis direction.

Further, the length Y1 of the flat part 120D1 in the Y axis direction may be different from the length Y2 of the flat part 120D2 in the Y axis direction.

In a case where the length Y1 is different from the length Y2, a frequency of a natural vibration generated at the flat part 120D1 is different from a frequency of a natural vibration generated at the flat part 120D2.

Accordingly, in a case where a wavelength of a standing wave at the flat part 120D1 is $\lambda p1$, it becomes possible, by setting the difference between the length Y1 and the length Y2 to be one-quarter of $\lambda p1$, to make it difficult for a standing wave to be generated at the flat part 120D2 through a vibration of a standing wave propagated from the flat part 120D1 to the flat part 120D2 via the periodic structure 120C.

Here, in a case where the length Y2 is greater than the length Y1 by $\lambda p1/4$, a standing wave (natural vibration) of a wavelength $\lambda p2$ is generated at the flat part 120D2 at a frequency somewhat lower than a frequency at which a standing wave of a wavelength $\lambda p1$ is generated at the flat part 120D1 as described above. For example, in a case where the length Y1 is 4-fold of $\lambda p1$ and the length Y2 is 4-fold of $\lambda p2$, the length ratio of $\lambda p1$ to $\lambda p2$ is 4:4.25, which is a ratio close to 1:1. Accordingly, the difference between the length Y1 and the length Y2 is approximately $\lambda p2/4$, even in consideration of $\lambda p2$ as a reference. Therefore, even in a case of a standing wave at the flat part 120D2 propagating to the flat part 120D1 via the periodic structure 120C, generation of the standing wave can be made difficult at the flat part 120D1.

Note that in a case where a frequency of a natural vibration generated at the flat part 120D1 is different from a frequency of a natural vibration generated at the flat part 120D2, frequencies in the ultrasound frequency band of driving signals for driving the vibrating elements 140A and 140B are different from each other.

For driving the vibrating elements 140A and 140B by using driving signals of different frequencies, two sinusoidal wave generators 310 (see FIG. 6) may be provided. Then, the two sinusoidal wave generators 310 generate sinusoidal waves of respective frequencies, the amplitude modulator 320 may modulate their amplitudes, and the sinusoidal waves are input to the amplifiers 141A and 141B. Instead of providing two of the sinusoidal wave generators 310 (see FIG. 6), a single sinusoidal wave generator 310 may generate sinusoidal waves for two types of frequencies.

In the following, variation examples of the embodiment will be described with reference to FIG. 12 to FIG. 22.

Figure 12:
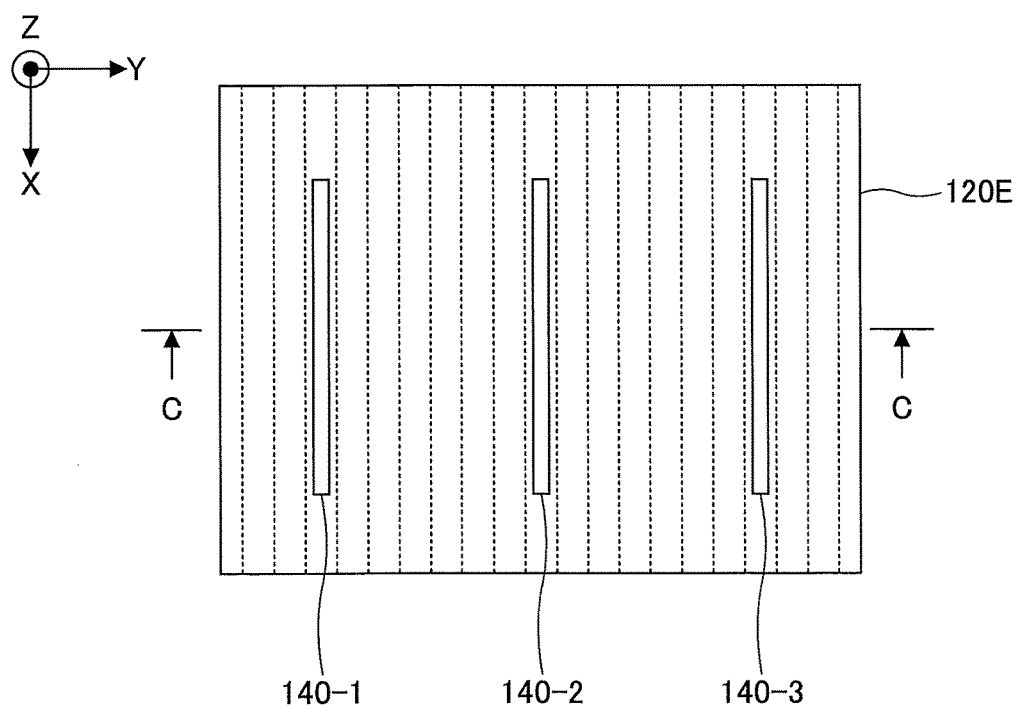
FIG. 12 is a diagram illustrating a top panel having a periodic structure.
Figure 13:
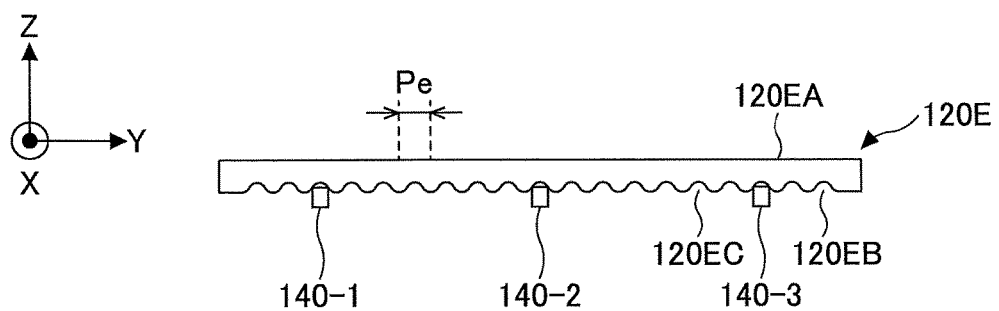
FIG. 13 is a diagram illustrating the top panel having the periodic structure.

FIG. 12 and FIG. 13 are diagrams illustrating a top panel 120E having a periodic structure 120EC. FIG. 12 is a plan view, and FIG. 13 is a cross-sectional view taken along a line C-C of FIG. 12.

For example, the periodic structure 120EC is disposed on the back surface 120EB of the top panel 120E. The front surface 120EA of the top panel 120E is flat.

The periodic structure 120EC is provided from the negative side edge of the top panel 120E in the Y axis direction to the positive side edge of the top panel 120E in the Y axis direction. The periodic structure 120EC is realized by the back surface 120EB having a shape of sinusoidally repeating a convexity and a concavity to change the thickness of the top panel 120E. In the periodic structure 120EC, the convexity and the concavity are repeated in the Y axis direction at a pitch Pe.

Note that although the cross sectional shape of the periodic structure 120EC is a sinusoidal shape, the periodic structure 120EC reflects a standing wave in the ultrasound frequency band that propagates through the top panel 120E, similar to the periodic structure 120C illustrated in FIG. 10.

Vibrating elements 140-1, 140-2, and 140-3 are provided on the back surface of the top panel 120E. For example, the vibrating elements 140-1, 140-2, and 140-3 are disposed on concave parts of the periodic structure 120EC. Note that FIG. 12 illustrates the vibrating elements 140-1, 140-2, and 140-3 in a transparent manner.

In order to locally confine standing waves in the ultrasound frequency band generated by the vibrating elements 140-1, 140-2, and 140-3 at the top panel 120E to the vicinity of the respective vibrating elements 140-1, 140-2, and 140-3, the periodic structure 120EC is provided from the negative side edge of the top panel 120E in the Y axis direction to the positive side edge of the top panel 120E in the Y axis direction.

Because the vibrating elements 140-1, 140-2, and 140-3 are attached to the top panel 120E at a portion where the periodic structure 120EC is provided, vibrations in the ultrasound frequency band generated by the respective vibrating elements 140-1, 140-2, and 140-3 are reflected by the periodic structure 120EC. Hence, the periodic structure 120EC can locally confine the respective standing waves in the ultrasound frequency band generated by the vibrating elements 140-1, 140-2, and 140-3 at the top panel 120E to the vicinity of the vibrating elements 140-1, 140-2, and 140-3.

A pitch Pe of the periodic structure 120EC may be set to satisfy approximately $\lambda me/2$ when the wavelength of a standing wave generated at the periodic structure 120EC is $\lambda me$. Here, the wavelength $\lambda me$ may be treated as a wavelength of a vibration that propagates through the periodic structure 120EC.

Further, the periodic structure 120EC extends, over the X axis direction, from the positive side edge of the top panel 120E in the X axis direction to the negative side edge of the top panel 120E in the X axis direction.

The length of the top panel 120E in the Y axis direction may be set to be a length obtained by multiplying approximately $\lambda pe/2$ by a natural number. The length of the top panel 120E in the Y axis direction is required to be set in accordance with a structure such as a thickness, a Young's modulus, and a periodic structure 120EC of the top panel 120E, for example. Thus, it is not necessarily preferable to precisely set the length of the top panel 120E in the Y axis direction to be a natural-number-fold length of $\lambda pe/2$. Therefore, description is of as setting the lengths Y1 and Y2 to be a natural-number-fold length of approximately $\lambda pe/2$.

For example, the wavelength $\lambda pe$ may be set, through a simulation, an experiment, and/or the like, based on a propagation speed or a wavelength of a standing wave generated at the top panel 120E.

In this way, the pitch P of the periodic structure 120EC is set to be approximately $\lambda me/2$ so as to increase a reflection coefficient by generating a Bragg reflection of a standing wave at the periodic structure 120EC. Because a velocity of a standing wave that propagates through the top panel 120E depends on a thickness of the top panel 120E, it is possible to constitute a structure suitable for generating a Bragg reflection by changing the thickness of the top panel 120E in a periodic manner.

Note that in some cases, it is difficult to calculate a wavelength $\lambda me$ of a standing wave. Therefore, the wavelength $\lambda me$ may be set, through a simulation, an experiment, and/or the like, based on a propagation speed or a wavelength of a standing wave at a section of the periodic structure 120EC, for example.

The vibrating elements 140-1, 140-2, and 140-3 are disposed, on the back surface 120EB of the top panel 120E, at equal intervals in the Y axis direction to extend in the X axis direction. The center of the width of the vibrating element 140-2 in the Y axis direction matches the center of the length of the top panel 120E in the Y axis direction.

Each of the vibrating elements 140-1, 140-2, and 140-3 may be any element as long as it can generate a vibration in the ultrasound frequency band. For example, similar to the vibrating elements 140A and 140B (see FIG. 9 and FIG. 10), a piezoelectric element may be used as each of the vibrating elements 140-1, 140-2, and 140-3, for example. One of the vibrating elements 140-1, 140-2, and 140-3 is an example of a first vibrating element, and the other two are an example of a second vibrating element.

Frequencies of driving signals for driving the vibrating elements 140-1, 140-2, and 140-3 may be the same, or may be different.

In other words, if natural vibrations (standing waves) in the ultrasound frequency band are locally generated within the vicinity of the vibrating elements 140-1, 140-2, and 140-3 by using driving signals of a same equal frequency to drive the vibrating elements 140-1, 140-2, and 140-3, the vibrating elements 140-1, 140-2, and 140-3 may be driven by driving signals of the same equal frequency.

If natural vibrations (standing waves) in the ultrasound frequency band are not locally generated within the vicinity of the vibrating elements 140-1, 140-2, and 140-3 by using driving signals of a same equal frequency to drive the vibrating elements 140-1, 140-2, and 140-3, the vibrating elements 140-1, 140-2, and 140-3 may be driven by driving signals of different frequencies.

In this case, for driving the vibrating elements 140-1, 140-2, and 140-3 by using driving signals of different frequencies, three sinusoidal wave generators 310 (see FIG. 6) may be provided. Then, the three sinusoidal wave generators 310 generate sinusoidal waves of respective frequencies, the amplitude modulator 320 may modulate their amplitudes, and the vibrating elements 140-1, 140-2, and 140-3 may be driven. In a case where the vibrating elements 140-1 and 140-3 can be driven at the same frequency because of symmetry of positions of the vibrating elements 140-1 and 140-3, they may be driven as follows. Two sinusoidal wave generators 310 (see FIG. 6) may be provided, the two sinusoidal wave generators 310 may generate sinusoidal waves of respective frequencies, and the amplitude modulator 320 may modulate their amplitudes. Then, the vibrating elements 140-1 and 140-3 and the vibrating element 140-2 may be driven by driving signals of frequencies different from each other.

Figure 14:
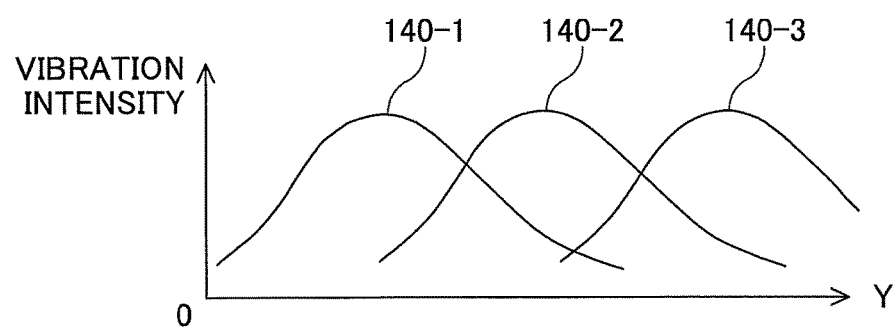
FIG. 14 is a diagram illustrating distributions in the Y axis direction of intensities of vibration generated at the top panel.

FIG. 14 is a diagram illustrating distributions in the Y axis direction of intensities of vibration generated at the top panel 120E. The distributions of the vibration intensities illustrated in FIG. 14 schematically illustrate a simulation result by a finite element method using a model of the top panel 120E. The vibration intensities illustrated in FIG. 14 are represented by envelope curves of amplitudes at antinodes of standing waves at a positive side in the Z axis direction when the vibrating elements 140-1, 140-2 and 140-3 are driven.

The horizontal axis represents a position of the top panel 120E in the Y axis direction, and the negative side edge of the top panel 120E in the Y axis direction corresponds to zero. Further, the vertical axis represents an intensity of vibration generated at the top panel 120E. The intensity of vibration can be treated as the amplitude of the standing wave.

Further, FIG. 14 illustrates a distribution (140-1) of vibration intensities for a case where the vibrating element 140-1 is driven, a distribution (140-2) of vibration intensities for a case where the vibrating element 140-2 is driven, and a distribution (140-3) of vibration intensities for a case where the vibrating element 140-3 is driven.

It is found that when the vibrating element 140-1 is driven, the vibration is locally generated at both sides of the vibrating element 140-1. This is similarly applied to the vibrating elements 140-2 and 140-3.

In this way, it is found that the natural vibration in the ultrasound frequency band can be locally generated at the top panel 120E by driving the vibrating element 140-1, 140-2, or 140-3.

This is because the periodic structure 120EC makes it difficult to propagate a standing wave between the vibrating elements 140-1, 140-2, and 140-3.

In this way, by driving any one of the vibrating elements 140-1, 140-2, and 140-3, the standing wave in the ultrasound frequency band can be generated at the top panel 120E. Therefore, it is possible to efficiently generate the standing wave relative to a case of generating the standing wave in the ultrasound frequency band at the entire top panel 120E.

Accordingly, one of the vibrating elements 140-1, 140-2, and 140-3 may be driven in accordance with a position at which the user's fingertip(s) touches the top panel 120E. More specifically, when a position of a manipulation input detected by the touch panel 150 is around the vibrating element 140-1, the vibrating element 140-1 is driven. When a position of a manipulation input detected by the touch panel 150 is within the vicinity of the vibrating element 140-2, the vibrating element 140-2 is driven. When a position of a manipulation input detected by the touch panel 150 is within the vicinity of the vibrating element 140-3, the vibrating element 140-3 is driven.

In this way, one of the vibrating elements 140-1, 140-2, and 140-3 may be driven in accordance with a position at which the user's fingertip(s) touches the top panel 120E. Hence, the natural vibration (standing wave) in the ultrasound frequency band can be efficiently generated at the top panel 120E by driving one of the vibrating elements 140-1, 140-2, and 140-3 with more reduced electric power, than a case where the natural vibration (standing wave) in the ultrasound frequency band is generated at the entire top panel 120E.

Therefore, electric power consumption can be reduced.

Note that there is a case in which the vibrating elements 140-1, 140-2, and 140-3 disturb displaying by the display panel 160 because of being disposed at a central portion of the top panel 120E. In such a case where the vibrating elements 140-1, 140-2, and 140-3 disturb displaying by the display panel 160, an electronic device without including a display panel 160 may be applied.

Note that although the periodic structure 120EC is provided on the back surface 120EB of the top panel 120E in the embodiment described above, the periodic structure 120EC may be provided on the front surface 120EA of the top panel 120E.

Figure 15:
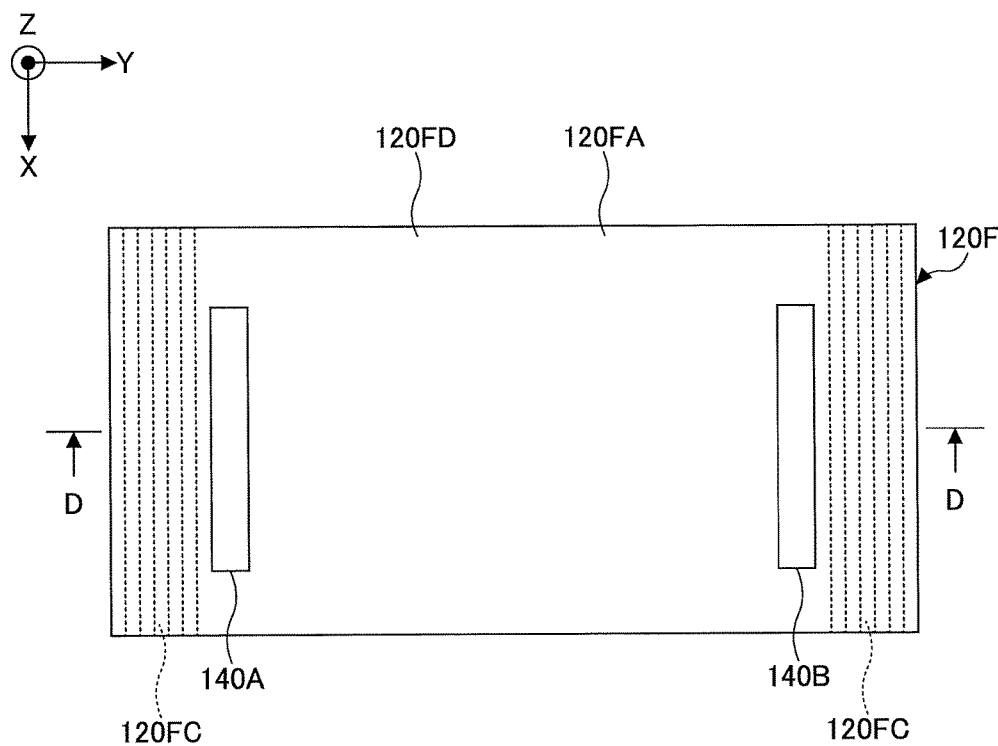
FIG. 15 is a diagram illustrating a top panel having a periodic structure.
Figure 16:
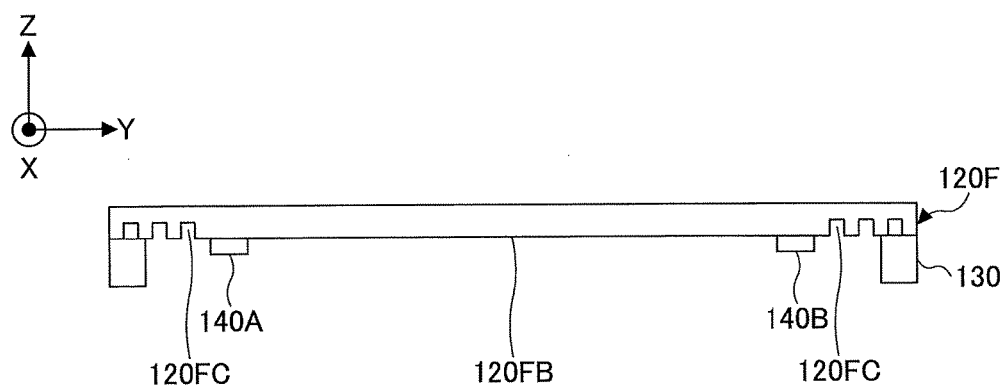
FIG. 16 is a diagram illustrating the top panel having the periodic structure.

FIG. 15 and FIG. 16 are diagrams illustrating a top panel 120F having a periodic structure 120FC. FIG. 15 is a plan view, and FIG. 16 is a cross-sectional view taken along a line D-D of FIG. 15. FIG. 15 illustrates vibrating elements 140A and 140B in a transparent manner.

The top panel 120F has two periodic structures 120FC and a flat part 120FD. Further, on the back surface 120FB of the top panel 120F, the vibrating elements 140A and 140B are disposed. Here, the vibrating elements 140A and 140B are driven at the same time.

The flat part 120FD is provided on a central part of the top panel 120F in the Y axis direction except for both ends.

For example, the periodic structures 120FC are disposed, on the back surface 120B of the top panel 120F, at a negative side end part in the Y axis direction and at a positive side end part in the Y axis direction. Thus, the front surface 120FA of the top panel 120F is flat.

Each of the periodic structures 120FC has three recessed parts arranged at equal intervals in the Y axis direction, and two protruding parts. The recessed parts and the two protruding parts of each of the periodic structures 120FC are respectively similar to the recessed parts 120CA1 to 120CA3 and the protruding parts 120CB1 and 120CB2 illustrated in FIG. 10.

In a case where a wavelength of a standing wave at the flat part 120FD is $\lambda pf$, the length of the flat part 120D in the Y axis direction may be set to be a length, obtained by multiplying approximately $\lambda pf/2$ by a natural number. This is because having a natural-number-fold length of the half wavelength is a condition for generating a standing wave.

Note that it is not necessarily preferable to precisely set the length of the top panel 120F in the Y axis direction to be a natural-number-fold length of $\lambda p/2$. Therefore, description is of as setting the length to be a natural-number-fold length of approximately $\lambda p/2$.

For example, the wavelength $\lambda p$ may be set, through a simulation, an experiment, and/or the like, based on a propagation speed or a wavelength of a standing wave generated at a section of the flat part 120FD.

A pitch P of the periodic structures 120FC may be set to satisfy approximately $\lambda mf/2$ when the wavelength of a standing wave generated at the periodic structures 120FC is $\lambda mf$. Here, the wavelength $\lambda mf$ may be treated as a wavelength of a vibration that propagates through the periodic structures 120C.

Note that the pitch P is a pitch between the adjacent recessed parts and is also a pitch between the adjacent protruding parts.

In this way, the pitch P of the periodic structures 120FC is set to be approximately $\lambda mf/2$ so as to increase a reflection coefficient by generating a Bragg reflection of a standing wave at the periodic structures 120C. Because a velocity of a standing wave that propagates through the top panel 120F depends on a thickness of the top panel 120F, it is possible to constitute a structure suitable for generating a Bragg reflection by changing the thickness of the top panel 120F in a periodic manner.

Note that in some cases, it is difficult to calculate a wavelength $\lambda mf$ of a standing wave generated at sections where the periodic structures 120FC are present within the top panel 120F. Therefore, the wavelength $\lambda mf$ may be set, through a simulation, an experiment, and/or the like, based on a propagation speed or a wavelength of a standing wave at the sections of the periodic structures 120FC, for example.

Here, when the negative side end part of the top panel 120F in the Y axis direction and the positive side end part of the top panel 120F in the Y axis direction are fixed to the housing 110 by the double-faced adhesive tape 130 (see FIG. 2 and FIG. 3), at the negative side end part of the top panel 120F in the Y axis direction and the positive side end part of the top panel 120F in the Y axis direction, the amplitude of a standing wave in the ultrasound frequency band may be limited and a Q factor of resonance may decrease.

In such a case, a standing wave may be reflected towards the center of the top panel 120 by the periodic structures 120FC provided at both ends of the top panel 120F in the Y axis direction so that energy of the standing wave is not absorbed at the fixing portion(s) of the top panel 120F and the housing 110.

Note that although the periodic structures 120FC partly overlap with the double-faced adhesive tape 130 in the Y axis direction in FIG. 16, it is not required for the periodic structures 120FC to overlap with the double-faced adhesive tape 130. Specifically, the top panel 120F may be attached, by the double-faced adhesive tape 13, to the housing (see FIG. 3) outside the periodic structures 120FC in the Y axis direction.

Figure 17:
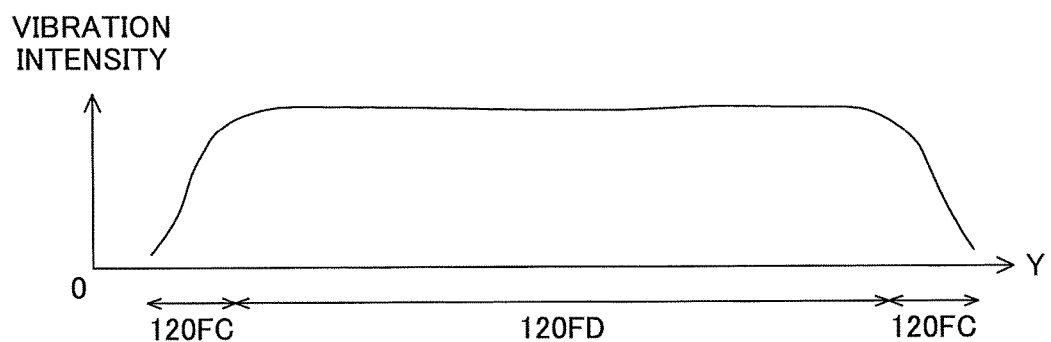
FIG. 17 is a diagram illustrating a distribution in the Y axis direction of intensities of vibration generated at the top panel.

FIG. 17 is a diagram illustrating a distribution in the Y axis direction of intensities of vibration generated at the top panel 120F. The distribution of the vibration intensities illustrated in FIG. 17 schematically illustrates a simulation result by a finite element method using a model of the top panel 120F. The vibration intensity illustrated in FIG. 17 is represented by an envelope curve of amplitude at antinodes of a standing wave at a positive side in the Z axis direction when the vibrating elements 140A and 140B are driven.

The horizontal axis represents a position of the top panel 120F in the Y axis direction, and the negative side edge of the top panel 120 in the Y axis direction corresponds to zero. Further, for the horizontal axis, sections where the flat part 120FD and the periodic structures 120FC at both ends are present are illustrated. Further, the vertical axis represents an intensity of vibration generated at the top panel 120F. The intensity of vibration can be treated as the amplitude of the standing wave.

It is found that when the vibrating elements 140A and 140B are driven, a standing wave in the ultrasound frequency band of constant amplitude is generated in the section where the flat part 120FD of the top panel 120F is present.

Further, it is found that, at both ends of the top panel 120F in the Y axis direction, the vibration is damped by reflection in the sections where the periodic structures 120FC are present.

In this way, it is found that, by driving the vibrating elements 140A and 140B, standing waves in the ultrasound frequency band can be generated at the top panel 120FD, and the vibration is damped by the periodic structures 120FC at both ends where the top panel 120F is fixed to the housing 110.

Accordingly, it is possible to obtain a structure in which energy of standing waves is not easily absorbed at the fixing portion of the top panel 120F and the housing 110. That is, it is possible to obtain a structure in which losses in energy of standing waves do not easily occur at the fixing portion of the top panel 120F and the housing 110.

Accordingly, by using the top panel 120F, the Q factor of resonance can be improved, standing waves in the ultrasound frequency band can be generated at the top panel 120F with high efficiency, and electric power consumption can be reduced.

Note that although the periodic structures 120FC are provided on the back surface 120FB of the top panel 120F in the embodiment describe above, the periodic structures 120FC may be provided on the front surface 120FA of the top panel 120F.

Further, the number of recessed parts of the periodic structures 120FC is not limited to three, and may be any suitable number that is two or more.

Additionally, FIG. 15 and FIG. 16 illustrate an embodiment where the two vibrating elements 140A and 140B are attached to the back surface 120FB of the top panel 120F. However, only one of the vibrating elements 140A and 140B may be attached to the top panel 120F to generate, at the entire top panel 120F, a standing wave in the ultrasound frequency band.

Figure 18:
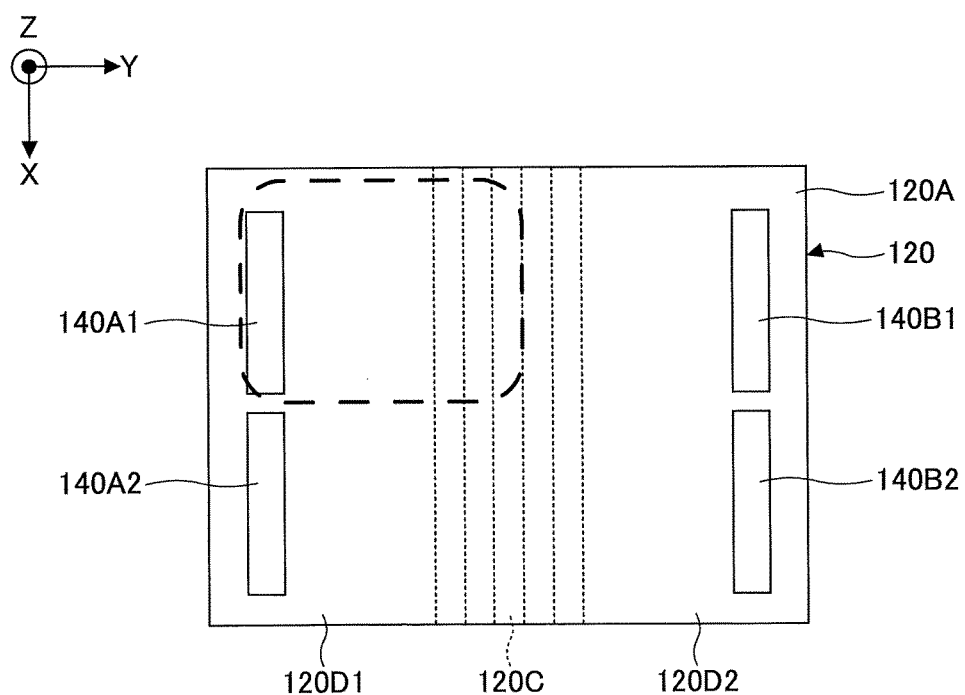
FIG. 18 is a plan view illustrating a state in which vibrating elements are attached to the top panel.

FIG. 18 is a plan view illustrating a state in which vibrating elements 140A1, 140A2, 140B1, and 140B2 are attached to the top panel 120. FIG. 18 illustrates the vibrating elements 140A1, 140A2, 140B1, and 140B2 in a transparent manner.

The top panel 120 is similar to that illustrated in FIG. 9 and FIG. 10.

The vibrating elements 140A1 and 140A2 and the vibrating elements 140B1 and 140B2 are respectively elements obtained by dividing the vibrating element 140A and the vibrating element 140B illustrated in FIG. 9 and FIG. 10 in two elements in the X axis direction.

In this way, by separately driving the vibrating elements 141A1, 140A2, 140B1 and 140B2 that are short in the longitudinal direction, an area where standing waves in the ultrasound frequency band are generated at the top panel 120 can be divided in the X axis direction.

For example, by driving only the vibrating element 140A1, a standing wave in the ultrasound frequency band can be selectively generated at an area illustrated by the broken line in FIG. 18. This is similarly applied to the vibrating elements 140A2, 140B1, and 140B2.

It may be determined which of the vibrating elements 140A1, 140A2, 140B1, and 140B2 is to be driven based on a position of a manipulation input detected by the touch panel 150. For example, in a case where a position of a manipulation input detected by the touch panel 150 is within the area illustrated by the broken line in FIG. 18, the vibrating element 140A1 may be driven.

In this way, by driving the vibrating elements 140A1, 140A2, 140B1, and 140B2 that are smaller than the vibrating elements 140A and 140B illustrated in FIG. 9 and FIG. 10, electric power consumption can be further reduced.

Further, because an area of a portion at which a vibration for providing a tactile sensation is generated can be reduced, an emitted amount of ultrasound waves emitted from the surface 120A of the top panel 120 can be further reduced.

Figure 19:
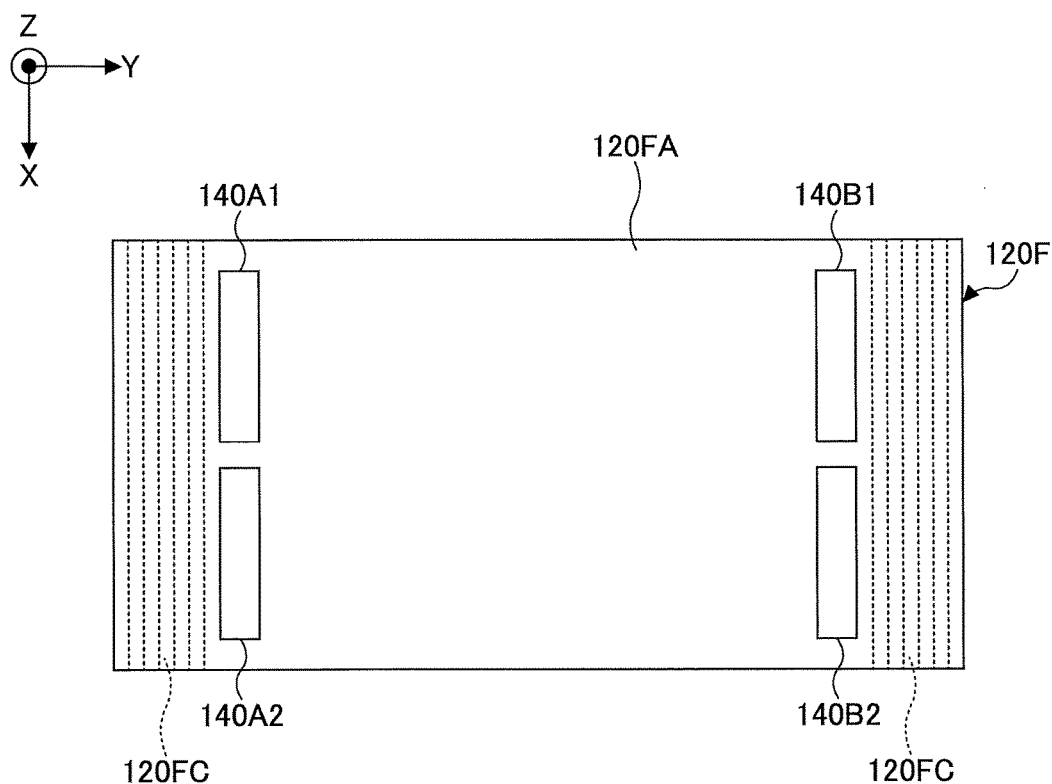
FIG. 19 is a plan view illustrating a state in which vibrating elements are attached to the top panel.

Further, by driving any two of the vibrating elements 140A1, 140A2, 140B1, and 140B2, tactile sensations can be simultaneously provided at two areas. FIG. 19 is a plan view illustrating a state in which the vibrating elements 140A1, 140A2, 140B1, and 140B2 are attached to the top panel 120F. FIG. 19 illustrates the vibrating elements 140A1, 140A2, 140B1, and 140B2 in a transparent manner.

The top panel 120F is similar to that illustrated in FIG. 15 and FIG. 16. Further, the vibrating elements 140A1, 140A2, 140B1, and 140B2 are similar to those illustrated in FIG. 18.

By attaching the vibrating elements 140A1, 140A2, 140B1, and 140B2 to the top panel 120F, electric power consumption can be further reduced according to a synergy between improvement of the Q factor of resonance and reduction of electric power consumption by the use of the small vibrating elements 140A1, 140A2, 140B1, and 140B2.

Here, variation examples of the electronic device 100 of the embodiment will be described with reference to FIG. 20 and FIG. 21.

Figure 20:
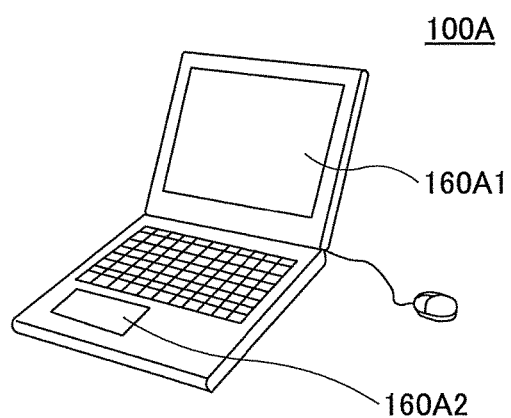
FIG. 20 is a diagram illustrating an electronic device of a variation example.

FIG. 20 is a diagram illustrating an electronic device 100A of a variation example. The electronic device 100A is a notebook Personal Computer (PC).

The PC 100A includes a display panel 160A1 and a touch pad 160A2.

Figure 21:
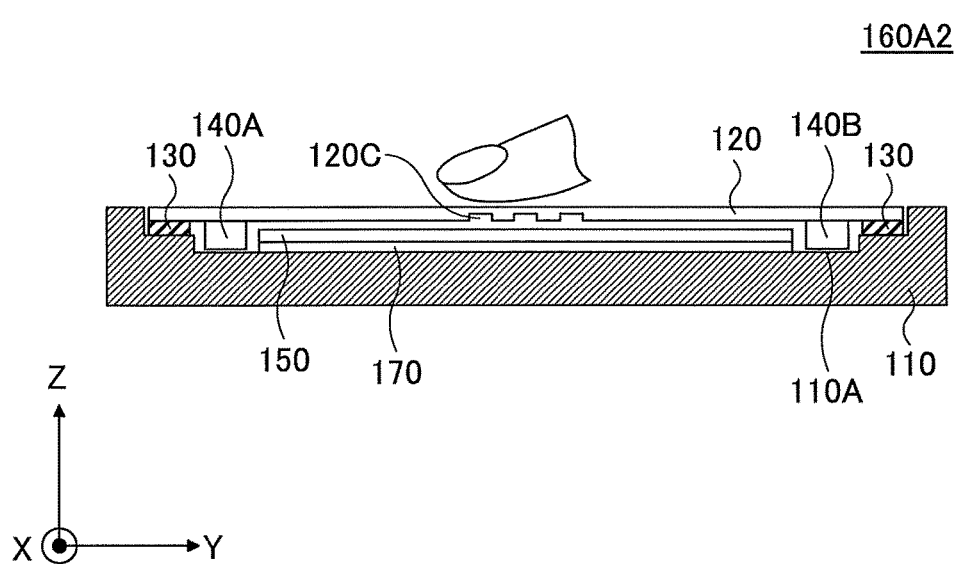
FIG. 21 is a diagram illustrating a cross section of a touch pad of the electronic device of the variation example.

FIG. 21 is a diagram illustrating a cross section of the touch pad 160A2 of the electronic device 100A of the variation example. The cross section illustrated in FIG. 21 corresponds to a cross section taken along the line A-A as illustrated in FIG. 3. In FIG. 21, an XYZ coordinate system, which is an orthogonal coordinate system, similar to that illustrated in FIG. 3 is defined.

The touch pad 160A2 has a configuration in which the display panel 160 is omitted from the electronic device 100 illustrated in FIG. 3.

By switching on/off the vibrating element 140A or 140B to generate the natural vibration in the ultrasound frequency band at the top panel 120 in accordance with a manipulation input performed on the touch pad 160A2 in the electronic device 100A as a PC as illustrated in FIG. 20, in a way similar to that of the electronic device 100 illustrated in FIG. 3, an operational feeling can be provided to the user's fingertip through tactile sensations in accordance with an amount of movement of the manipulation input performed on the touch pad 160A2.

The electronic device 100 illustrated in FIG. 3 may be provided instead of the display panel 160A1.

Although examples of an electronic device according to the embodiment of the present invention have been described above, the present invention is not limited to the embodiment specifically disclosed and various variations and modifications may be made without departing from the scope of the claims.

All examples and conditional language provided herein are intended for pedagogical purposes of aiding the reader in understanding the invention and the concepts contributed by the inventors to further the art, and are not to be construed as limitation to such specifically recited examples and conditions, nor does the organization of such examples in the specification relate to a showing of superiority and inferiority of the invention. Although one or more embodiments of the present invention have been described in detail, it should be understood that various changes, substitutions, and alterations could be made hereto without departing from the spirit and scope of the invention.

What is claimed is:

1. An electronic device comprising:
a top panel having a manipulation surface;
a coordinate detector configured to detect coordinates of a manipulation input performed on the manipulation surface;
a first vibrating element configured to generate a vibration at the manipulation surface; and
a drive controlling part configured to drive the first vibrating element by using a driving signal for generating a natural vibration in an ultrasound frequency band of the manipulation surface, the drive controlling part being configured to drive the first vibrating element such that an intensity of the natural vibration changes in accordance with a position of the manipulation input performed on the manipulation surface and in accordance with a degree of time change of the position,
wherein the top panel has a periodic structure whose thickness changes in a periodic manner in accordance with a period of a standing wave in a direction in which antinodes and nodes of the standing wave generated by the natural vibration are arrayed.

2. The electronic device according to claim 1, further comprising:
a second vibrating element, configured to generate a vibration at the manipulation surface, driven by the drive controlling part by using the driving signal such that the intensity of the natural vibration changes in accordance with the position of the manipulation input performed on the manipulation surface and in accordance with the degree of time change of the position,
wherein, the periodic structure is disposed on a central part of the top panel in the direction in which the antinodes and the nodes of the standing wave are arrayed, and the top panel has a first area with respect to the periodic structure in the direction and a second area located opposite to the first area with respect to the periodic structure, and
wherein the first vibrating element is disposed at the first area of the top panel, and
wherein the second vibrating element is disposed at the second area of the top panel.

3. The electronic device according to claim 2, wherein a first length of the first area in the direction is different from a second length of the second area in the direction.

4. The electronic device according to claim 3, wherein a difference between the first length and the second length is a length corresponding to one-quarter of a wavelength of the standing wave.

5. The electronic device according to claim 2, wherein a first frequency of the driving signal used to drive the first vibrating element is different from a second frequency of the driving signal used to drive the second vibrating element.

6. The electronic device according to claim 1, wherein the periodic structure is disposed in a periodic manner, along the direction in which the antinodes and the nodes of the standing wave are arrayed, over the entire manipulation surface of the top panel or over an entire surface opposite to the manipulation surface.

7. The electronic device according to claim 6, further comprising:
a second vibrating element, configured to generate a vibration at the manipulation surface, driven by the drive controlling part by using the driving signal such that the intensity of the natural vibration changes in accordance with the position of the manipulation input performed on the manipulation surface and in accordance with the degree of time change of the position, and
wherein the first vibrating element and the second vibrating element are disposed on the manipulation surface of the top panel or on a surface opposite to the manipulation surface.

8. The electronic device according to claim 1, wherein the periodic structure is disposed, on the manipulation surface of the top panel or on a surface opposite to the manipulation surface, at an end part in the direction in which the antinodes and the nodes of the standing wave are arrayed.

9. The electronic device according to claim 8, further comprising:
a housing configured to support the top panel,
wherein a portion where the top panel is fixed to the housing overlaps with the periodic structure at the end part of the top panel in a plan view, or is located outside the periodic structure at the end part of the top panel in a plan view.

10. The electronic device according to claim 8, wherein the first vibrating element is disposed, closer to a center of the top panel than the periodic structure is in a plan view, on the top panel.

11. The electronic device according to claim 8, further comprising:
- a second vibrating element, configured to generate a vibration at the manipulation surface, driven by the drive controlling part by using the driving signal such that the intensity of the natural vibration changes in accordance with the position of the manipulation input performed on the manipulation surface and in accordance with the degree of time change of the position,
- wherein the periodic structure is disposed, on the manipulation surface of the top panel or on a surface opposite to the manipulation surface, at each end of the top panel in the direction in which the antinodes and the nodes of the standing wave are arrayed,
- wherein the first vibrating element is disposed, closer to a center of the top panel than the periodic structure is at one end in the direction, on the top panel, and
- wherein the second vibrating element is disposed, closer to the center of the top panel than the periodic structure is at the other end in the direction, on the top panel.

12. The electronic device according to claim 1, wherein the periodic structure is recessed parts or protruding parts disposed on the manipulation surface of the top panel or on a surface opposite to the manipulation surface.

13. The electronic device according to claim 1, further comprising:
- a display part disposed at a surface side opposite to the manipulation surface of the top panel.

* * * * *